(12) United States Patent
Lee et al.

(10) Patent No.: US 10,847,685 B2
(45) Date of Patent: Nov. 24, 2020

(54) PHOTOLUMINESCENCE APPARATUS, METHOD OF MANUFACTURING THE SAME AND DISPLAY APPARATUS HAVING THE SAME

(71) Applicant: Samsung Display Co., Ltd., Yongin-si (KR)

(72) Inventors: Hee-Keun Lee, Suwon-si (KR); Taejin Kong, Suwon-si (KR); Hoon Kim, Ansan-si (KR); Keunwoo Park, Incheon (KR)

(73) Assignee: Samsung Display Co., Ltd.

( * ) Notice: Subject to any disclaimer, the term of this patent is extended or adjusted under 35 U.S.C. 154(b) by 332 days.

(21) Appl. No.: 15/825,340

(22) Filed: Nov. 29, 2017

(65) Prior Publication Data

US 2018/0269362 A1 Sep. 20, 2018

(30) Foreign Application Priority Data

Mar. 17, 2017 (KR) .................. 10-2017-0034035

(51) Int. Cl.
| | |
|---|---|
| G02B 26/02 | (2006.01) |
| H01L 33/50 | (2010.01) |
| H01L 31/0352 | (2006.01) |
| H01L 27/32 | (2006.01) |
| G09G 3/34 | (2006.01) |
| G02F 1/13357 | (2006.01) |
| G09G 3/36 | (2006.01) |
| G02F 1/1335 | (2006.01) |

(52) U.S. Cl.
CPC .......... *H01L 33/502* (2013.01); *G02F 1/1336* (2013.01); *G02F 1/133617* (2013.01); *G09G 3/3413* (2013.01); *G09G 3/3607* (2013.01); *H01L 27/322* (2013.01); *H01L 27/3272* (2013.01); *H01L 31/035218* (2013.01); *G02F 1/133512* (2013.01); *G02F 2001/133614* (2013.01); *G02F 2202/36* (2013.01)

(58) Field of Classification Search
CPC . H01L 33/502; H01L 27/322; H01L 27/3272; H01L 31/035218; G02F 1/133617; G02F 1/1336; G02F 2202/36; G02F 1/133512; G02F 2001/133614; G09G 3/3607; G09G 3/3413
USPC .......................................................... 359/227
See application file for complete search history.

(56) References Cited

U.S. PATENT DOCUMENTS

2015/0228232 A1* 8/2015 Lee .................. G02F 1/133617
345/88

FOREIGN PATENT DOCUMENTS

| KR | 10-2015-0116022 A | 10/2015 |
| KR | 10-2016-0028580 A | 3/2016 |
| KR | 10-2016-0084557 A | 7/2016 |

* cited by examiner

*Primary Examiner* — Euncha P Cherry
(74) *Attorney, Agent, or Firm* — Innovation Counsel LLP

(57) ABSTRACT

A photoluminescence apparatus includes a base substrate, a first color conversion pattern disposed on the base substrate, and having a color conversion material, wherein a first stop pattern is formed at the first color conversion pattern, and a capping layer disposed on the first color conversion pattern for capping the first color conversion pattern, wherein a first hole overlapping the first color conversion pattern in a plan view is formed through the capping layer. The first stop pattern is disposed adjacent to the first hole in a plan view.

18 Claims, 51 Drawing Sheets

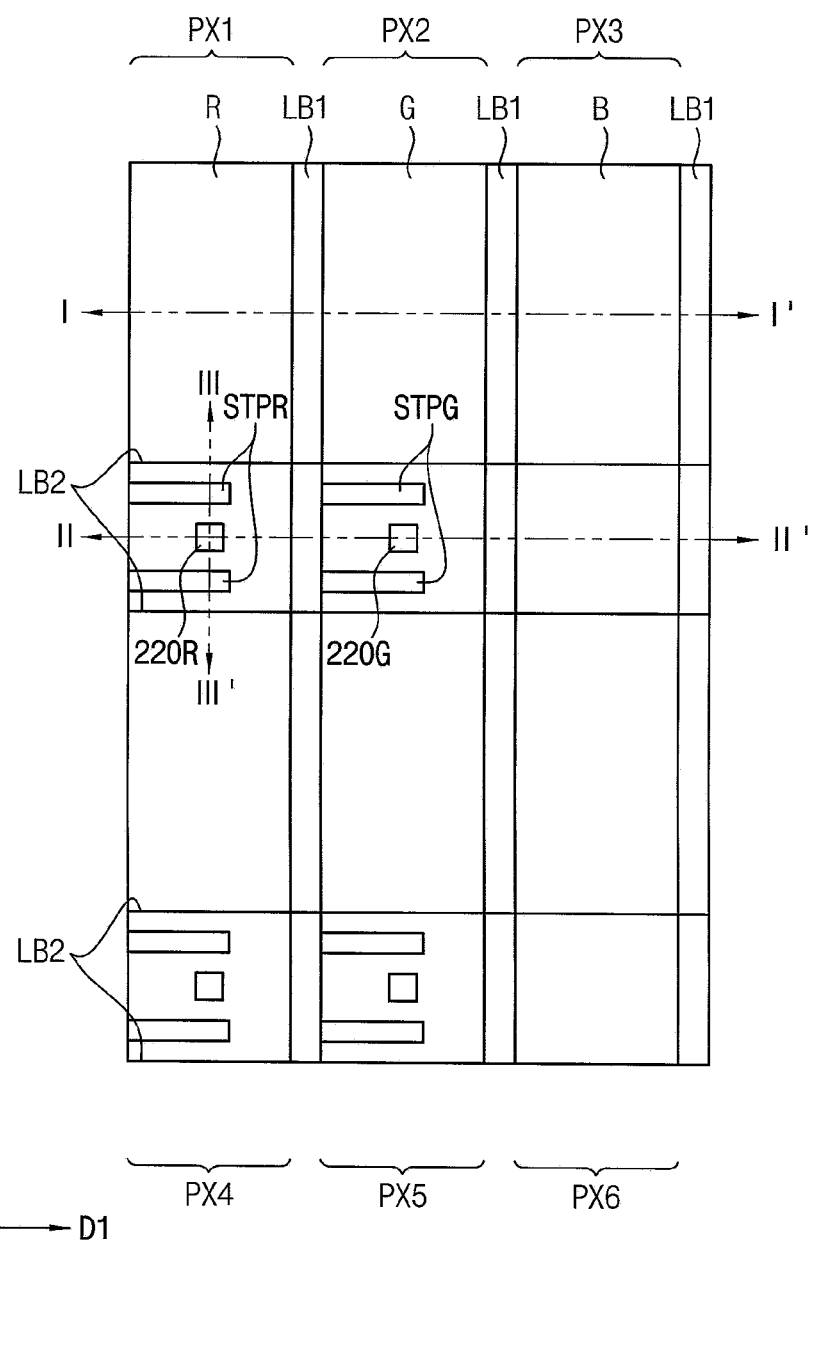

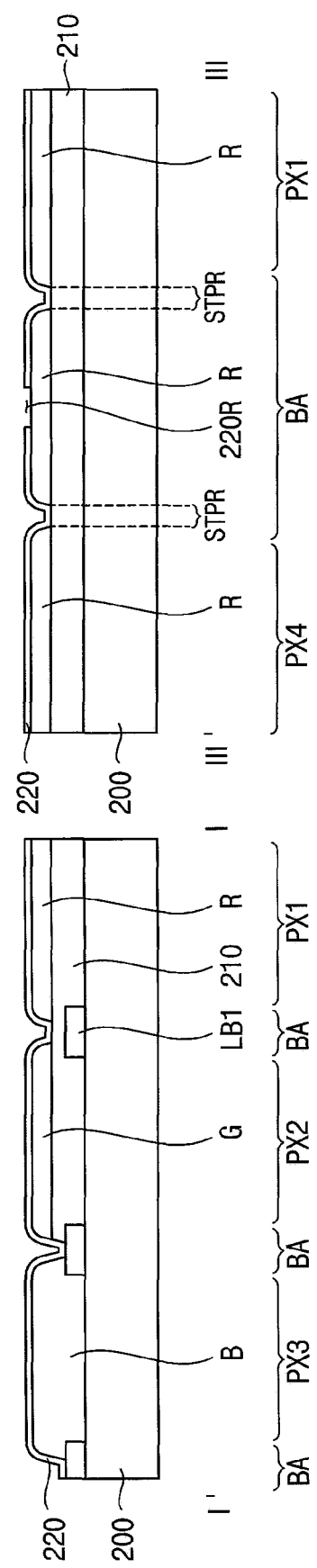

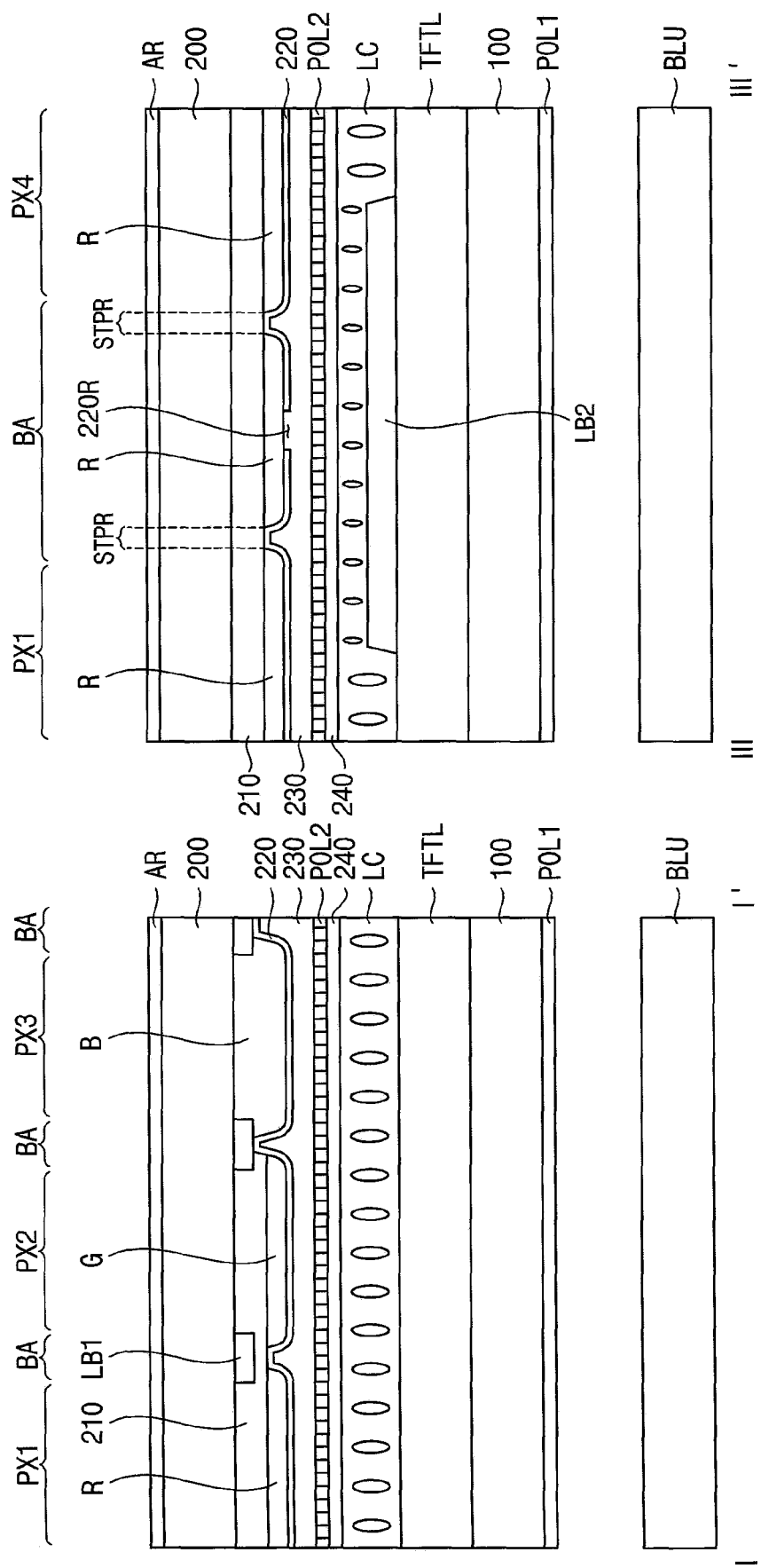

PHOTOLUMINESCENCE APPARATUS, METHOD OF MANUFACTURING THE SAME AND DISPLAY APPARATUS HAVING THE SAME

This application claims priority to and the benefit of Korean Patent Application No. 10-2017-0034035, filed on Mar. 17, 2017, the disclosure of which is incorporated by reference herein in its entirety.

BACKGROUND

1. Field

Example embodiments of the inventive concept relate to a photoluminescence apparatus, a method of manufacturing the photoluminescence apparatus, and a display apparatus having the photoluminescence apparatus. More particularly, example embodiments of the inventive concept relate to a photoluminescence apparatus using quantum dot, a method of manufacturing the photoluminescence apparatus, and a display apparatus having the photoluminescence apparatus.

2. Description of the Related Art

Recently, a display apparatus having light weight and small size has been manufactured. A cathode ray tube (CRT) display apparatus has been used due to a performance and a competitive price. However, the CRT display apparatus has a weakness with a size or portability. Therefore, a display apparatus, such as a plasma display apparatus, a liquid crystal display apparatus and an organic light emitting display apparatus, has been highly regarded due to its small size, light weight and low-power-consumption.

The display apparatus may further include a photoluminescence apparatus. The photoluminescence apparatus may include a color conversion structure, such as a quantum dot, for converting color of light for displaying an image. A desired image color may be achieved by the photoluminescence apparatus. Thus, it is possible to improve color reproducibility of the image, improve luminous efficiency, and improve display quality. However, the color conversion structure may have a problem in which uncured components remain in the manufacturing process, and have an active unfilled area (AUA) defect due to out-gassing, thereby resulting in deterioration of the display quality.

SUMMARY

One or more example embodiment of the inventive concept provides a photoluminescence apparatus capable of decreasing AUA defects and display quality degradation.

One or more example embodiments of the inventive concept also provide a method of manufacturing the photoluminescence apparatus.

One or more example embodiments of the inventive concept also provide a display apparatus having the photoluminescence apparatus.

According to an example embodiment of the inventive concept, a photoluminescence apparatus includes a base substrate, a first color conversion pattern disposed on the base substrate, and having a color conversion material, wherein a first stop pattern is formed at the first color conversion pattern, and a capping layer disposed on the first color conversion pattern for capping the first color conversion pattern, wherein a first hole overlapping the first color conversion pattern in a plan view is formed through the capping layer. The first stop pattern is disposed adjacent to the first hole in a plan view.

In an example embodiment, in a plan view, the first stop pattern may be extended in a first direction, and spaced apart from the first hole in a second direction that is perpendicular to the first direction.

In an example embodiment, the first stop pattern may be an opening pattern or a groove pattern formed at the first color conversion pattern.

In an example embodiment, a width of the first stop pattern may be about 10 to 15 µm.

In an example embodiment, the photoluminescence apparatus may further include a first light blocking pattern disposed on the base substrate and extending in a second direction. In a plan view, the first color conversion pattern may extend in the second direction substantially perpendicular to a first direction. The first light blocking pattern may be adjacent to the first color conversion pattern in the first direction and extend in the second direction.

In an example embodiment, the first light blocking pattern may further extend in the first direction to form a lattice structure. The first light blocking pattern, the first hole and the first stop pattern may be overlapped with each other.

In an example embodiment, the photoluminescence apparatus may further include a blue light blocking pattern disposed on the base substrate, a second color conversion pattern including green quantum dot particles and/or green phosphor, and a third color conversion pattern disposed on the base substrate and including scattering particles and/or blue pigment. The first color conversion pattern may include red quantum dot particles and/or red phosphor. The first color conversion pattern and the second color conversion pattern may overlap the blue light blocking pattern.

In an example embodiment, a second hole may be further formed at the capping layer overlapping the second color conversion pattern.

In an example embodiment, the first stop pattern may be formed at the first color conversion pattern and the blue light blocking pattern under the first color conversion pattern. The first stop pattern may be an opening pattern formed at the first color conversion pattern and an opening pattern formed at the blue light blocking pattern, or may be an opening pattern formed at the first color conversion pattern and a groove pattern formed at the blue light blocking pattern.

In an example embodiment, in a plan view, the first color conversion pattern may extend in a second direction substantially perpendicular to the first direction. The first stop pattern may include a 1a stop pattern and 1b stop pattern. The 1a stop pattern may be spaced apart from the first hole in the second direction. The 1b stop pattern may be spaced apart from the first hole in the second direction opposite to the 1a stop pattern.

In an example embodiment, the 1a stop pattern and/or the 1b stop pattern may extend to an edge of the first color conversion pattern.

According to an example embodiment of the inventive concept, a display apparatus includes a backlight unit generating a light, a first base substrate disposed on the backlight unit, a thin film transistor layer disposed on the first base substrate and including a thin film transistor, a second base substrate opposite to the first base substrate, a first color conversion pattern disposed on the base substrate and having a color conversion material, wherein a first stop pattern is formed at the first color conversion pattern, a capping layer disposed on the first color conversion pattern for capping the first color conversion pattern, wherein a first hole overlapping the first color conversion pattern in a plan view is formed through the capping layer, a liquid crystal layer disposed between the first base substrate and the second base substrate, and a light blocking layer overlapping the thin film transistor, the first stop pattern and the first hole.

In an example embodiment, the first stop pattern maybe opening pattern or groove pattern formed at the first color conversion pattern.

In an example embodiment, the display apparatus may further include a blue light blocking pattern disposed on the first base substrate, a second color conversion pattern including green quantum dot particles and/or green phosphor, and a third color conversion pattern disposed on the first base substrate and including scattering particles and/or blue pigment. The first color conversion pattern may include red quantum dot particles and/or red phosphor, and the first color conversion pattern and the second color conversion pattern overlaps with the blue light blocking pattern. The backlight unit may emit blue light.

In an example embodiment, the light blocking pattern may include a first light blocking pattern disposed between the liquid crystal layer and the second base substrate and a second light blocking pattern disposed between the liquid crystal layer and the first base substrate. The first hole and the first stop pattern may be overlapped with the second light blocking pattern.

In an example embodiment, the display apparatus may include a plurality of pixel areas for displaying image and a light blocking area between the pixel areas having a lattice structure. The first hole and the first stop pattern may be repeatedly formed for every several pixel areas.

According to an example embodiment of the inventive concept, a method of manufacturing a photoluminescence apparatus includes forming a first color conversion pattern including a color conversion material for converting color of incident light, and forming a capping layer on the first color conversion pattern for capping the first color conversion pattern, wherein a first hole is formed through the capping layer to expose a portion of the first color conversion pattern. A first spot pattern that is an opening pattern or a groove pattern is formed at the first color conversion pattern adjacent to the first hole.

In an example embodiment, the first color conversion pattern may be formed by coating a photoresist material containing quantum dot particles and/or phosphor, exposing and developing the photoresist material. The first stop pattern may be simultaneously patterned when the first color conversion pattern is formed.

In an example embodiment, the first color conversion pattern may be formed by coating a photoresist material containing quantum dot particles and/or phosphor, exposing and developing the photoresist material. And then, the first stop pattern may be formed by removing a portion of the first color conversion pattern.

In an example embodiment, the method may further include forming a blue light blocking pattern on the base substrate, forming a second color conversion pattern including green quantum dot particles and/or green phosphor on the blue light blocking pattern, forming a third color conversion pattern disposed on the first base substrate and including scattering particles and/or blue pigment on the base substrate, forming a planarization layer on the capping layer, forming a wire grid polarizer on the planarization layer, and forming an insulation layer on the wire grid polarizer.

According to the present inventive concept, a display apparatus includes a capping layer having a first hole and a first color conversion pattern at which a first stop pattern is formed. The first hole is formed at the capping layer, so that an active unfilled area (AUA) defect due to out-gas from the first color conversion pattern may be decreased. The first spot pattern is formed in the first color conversion pattern. Therefore, even if a part of the first color conversion pattern around the first hole is deteriorated, since the deteriorated portion of the first color conversion pattern is formed only in the light blocking area, display quality degradation due to the deterioration of the first color conversion pattern can be prevented.

In addition, the first stop pattern may have a pattern shape capable of maintaining the quality of the display apparatus even if an alignment error occurs during the step of forming the first stop pattern.

It is to be understood that both the foregoing general description and the following detailed description are exemplary and explanatory and are intended to provide further explanation of the invention as claimed

BRIEF DESCRIPTION OF THE DRAWINGS

The above and other features of the inventive concept will become more apparent by describing in detail example embodiments thereof with reference to the accompanying drawings, in which:

FIG. 12 is a plan view illustrating pixel areas of a portion of a display apparatus according to an example embodiment of the inventive concept;

FIGS. 22A, 22B, 22C and 22D are cross-sectional views illustrating a method of manufacturing a display apparatus of FIG. 14.

DETAILED DESCRIPTION

Hereinafter, the inventive concept will be explained in detail with reference to the accompanying drawings.

Figure 1:
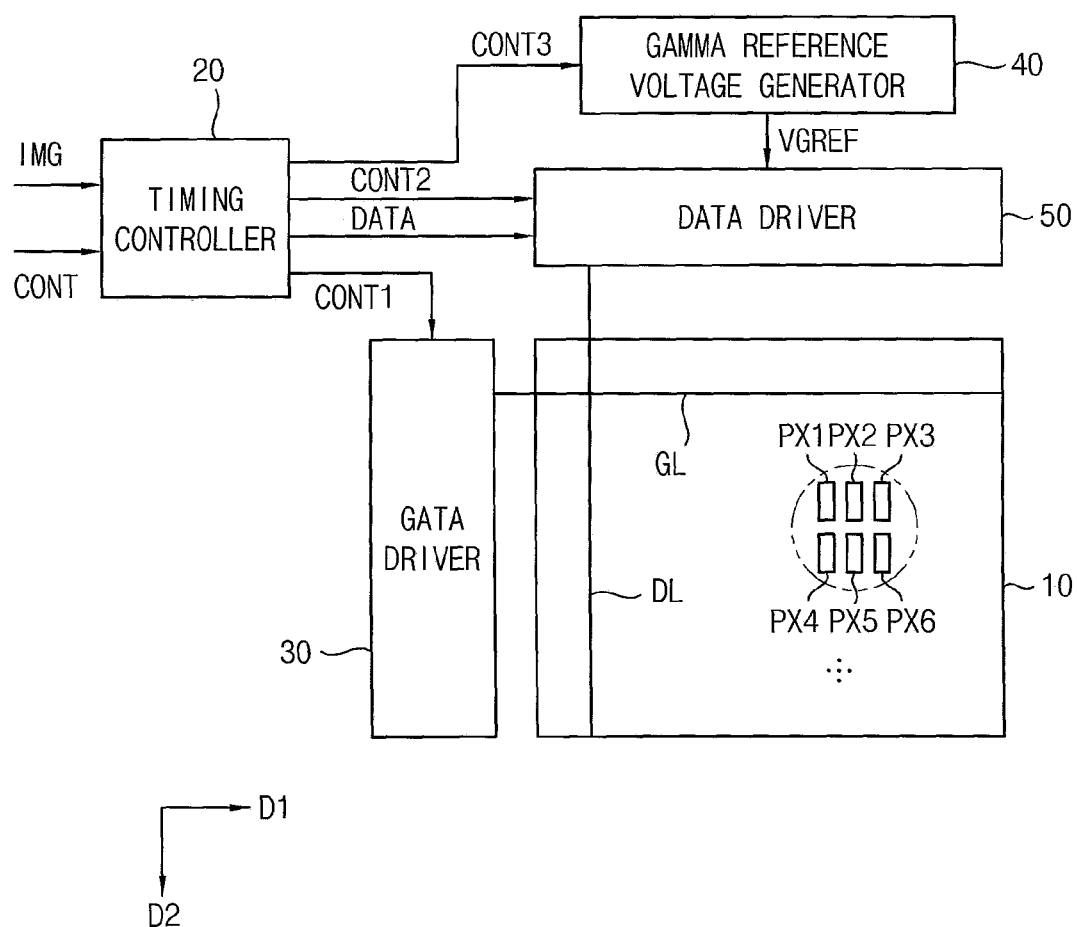
FIG. 1 is a block diagram illustrating a display apparatus according to an example embodiment of the inventive concept.

FIG. 1 is a block diagram illustrating a display apparatus according to an example embodiment of the inventive concept.

Referring to FIG. 1, the display apparatus may include a display panel 10 and a display panel driver. The display panel driver may include a timing controller 20, a gate driver 30, a gamma reference voltage generator 40 and a data driver 50. The display apparatus may further include a back light unit (refers to BLU of FIG. 3A)

The display panel 10 may include a plurality of gate lines GL, a plurality of data lines DL and a plurality of pixels electrically connected to the gate lines GL and the data lines DL. The gate lines GL may extend in a first direction D1, and the data lines DL may extend in a second direction D2 crossing the first direction D1.

The display panel 10 may include a first substrate, a second substrate facing the first substrate and a liquid crystal layer disposed between the first substrate and the second substrate. The gate lines, the data lines, pixel electrodes of the pixels and the switching elements may be formed on the first substrate. A common electrode may be formed on the second substrate.

The timing controller 20 may receive input image data IMG and an input control signal CONT from an external apparatus (not shown). The input image data may include red image data, green image data and blue image data. The input control signal CONT may include a master clock signal and a data enable signal. The input control signal CONT may further include a vertical synchronizing signal and a horizontal synchronizing signal.

The timing controller 20 may generate a first control signal CONT1, a second control signal CONT2, a third control signal CONT3 and a data signal DATA based on the input image data IMG and the input control signal CONT.

The timing controller 20 may generate the first control signal CONT1 for controlling an operation of the gate driver 30 based on the input control signal CONT, and outputs the first control signal CONT1 to the gate driver 30. The first control signal CONT1 may further include a vertical start signal and a gate clock signal.

The timing controller 20 may generate the second control signal CONT2 for controlling an operation of the data driver 50 based on the input control signal CONT, and outputs the second control signal CONT2 to the data driver 50. The second control signal CONT2 may include a horizontal start signal and a load signal.

The timing controller 20 may generate the data signal DATA based on the input image data IMG The timing controller 20 may output the data signal DATA to the data driver 50.

The timing controller 20 may generate the third control signal CONT3 for controlling an operation of the gamma reference voltage generator 40 based on the input control signal CONT, and output the third control signal CONT3 to the gamma reference voltage generator 40.

The gate driver 30 may generate gate signals driving the gate lines GL in response to the first control signal CONT1 received from the timing controller 20. The gate driver 300 may sequentially output the gate signals to the gate lines GL.

The gamma reference voltage generator 40 may generate a gamma reference voltage VGREF in response to the third control signal CONT3 received from the timing controller 20. The gamma reference voltage generator 40 may provide the gamma reference voltage VGREF to the data driver 50. The gamma reference voltage VGREF may have a value corresponding to a level of the data signal DATA.

In an exemplary embodiment, the gamma reference voltage generator 40 may be disposed in the timing controller 20, or in the data driver 50.

The data driver 50 may receive the second control signal CONT2 and the data signal DATA from the timing controller 20, and receive the gamma reference voltages VGREF from the gamma reference voltage generator 40. The data driver 50 may convert the data signal DATA into data voltages having an analog type using the gamma reference voltages VGREF. The data driver 50 may output the data voltages to the data lines DL.

The display apparatus may include a plurality of pixel areas. The pixel areas may be arranged in a matrix of 2 rows*3 columns. The pixel areas may include a first pixel area PX1, a second pixel area PX2, a third pixel area PX3, a fourth pixel area PX4, a fifth pixel area PX5, and a sixth pixel area PX6. A light blocking area (refers to BA of FIG. 3A), which separates the pixel areas and blocks light, may be formed between the first to sixth pixel areas.

Figure 2:
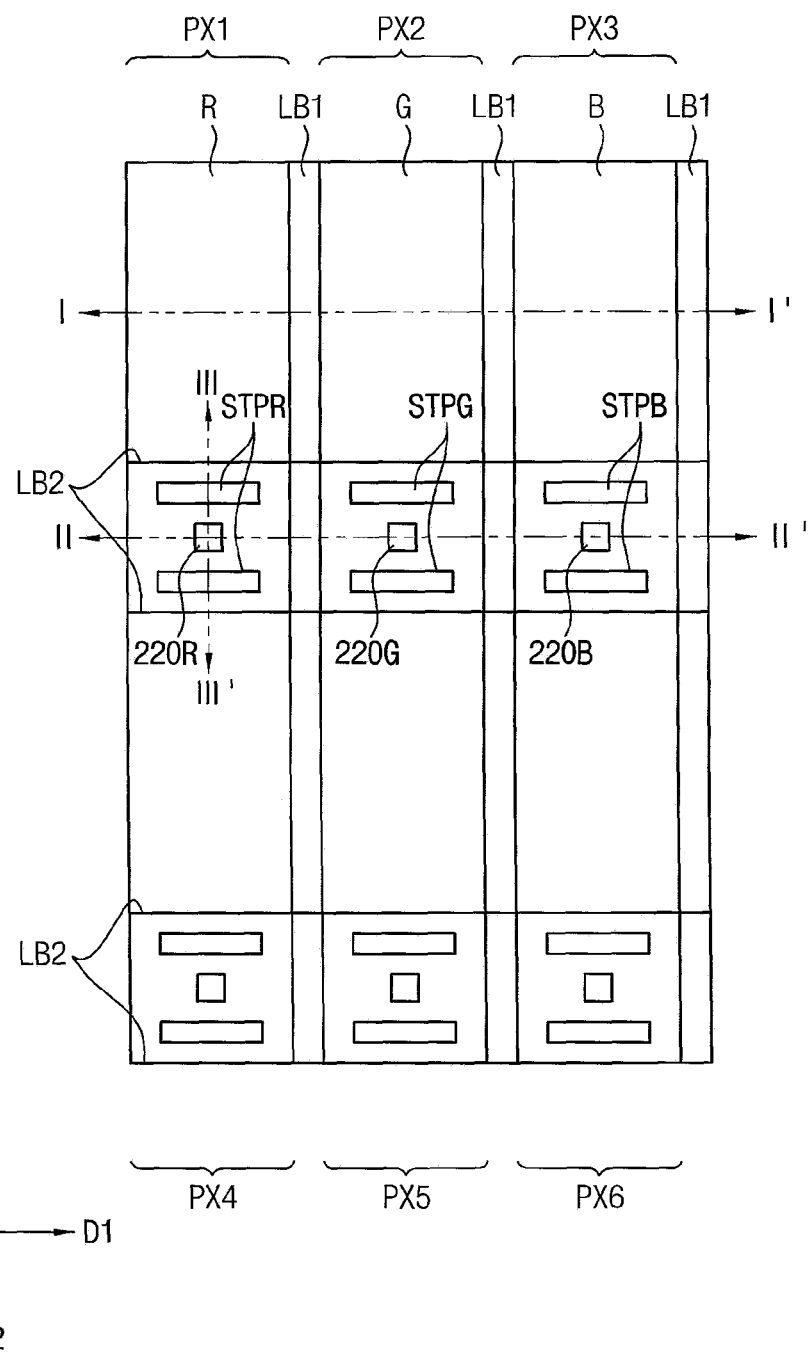
FIG. 2 is a plan view illustrating first to sixth pixels of the display apparatus of FIG. 1.
Figure 3A:
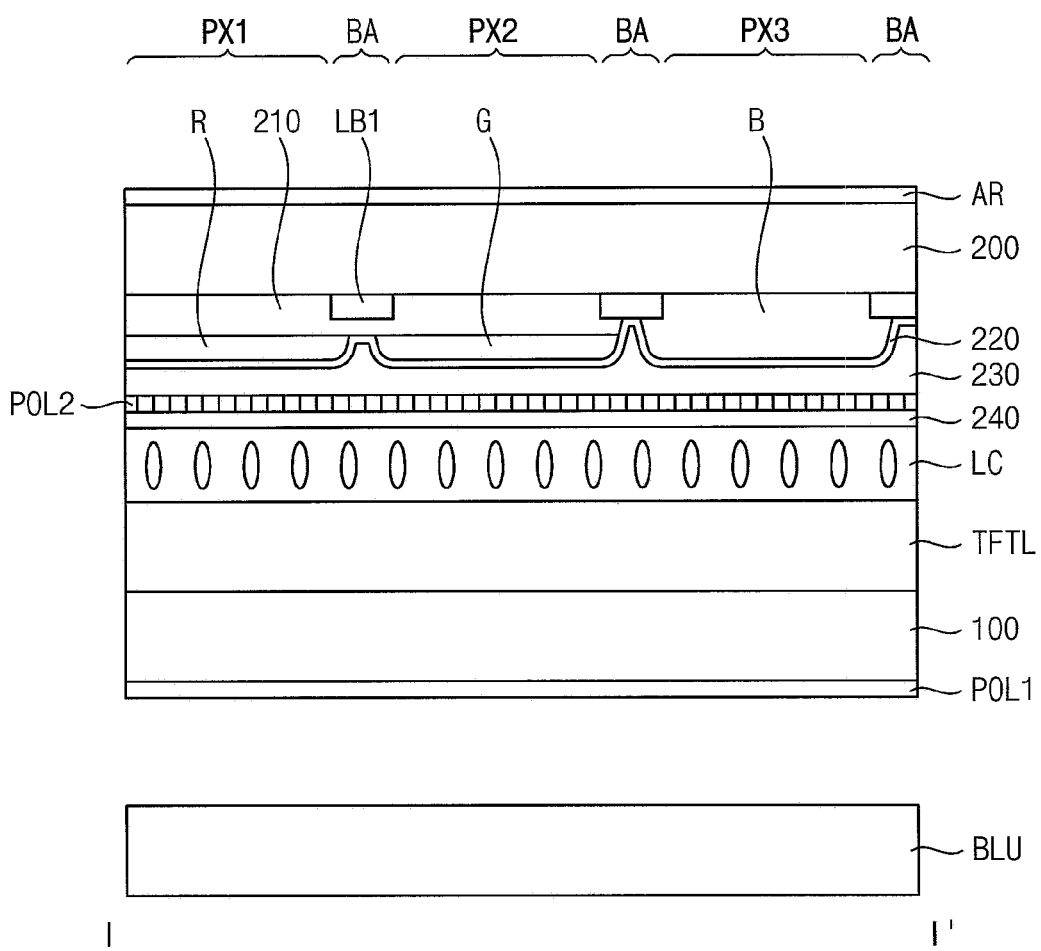
FIG. 3A is a cross-sectional view taken along a line I-I' of FIG. 2.
Figure 3B:
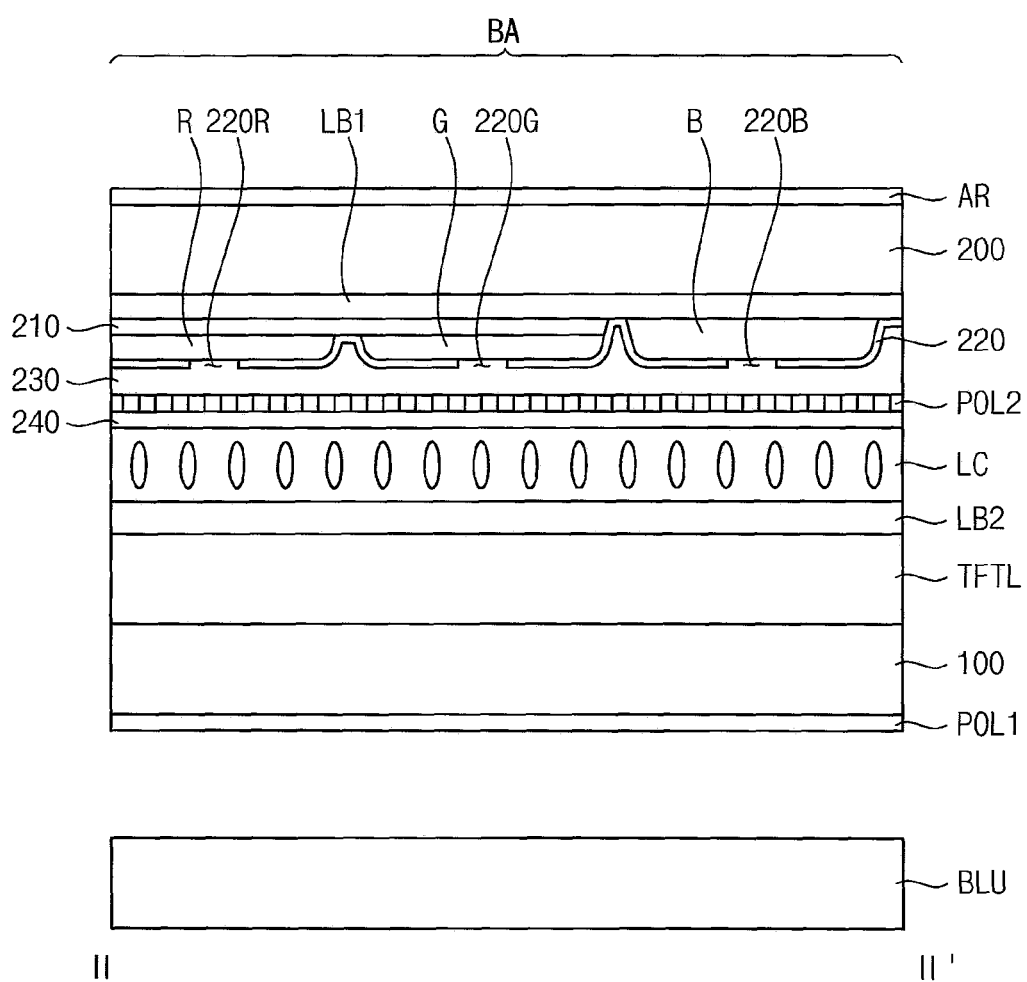
FIG. 3B is a cross-sectional view taken along a line II-II' of FIG. 2.
Figure 3C:
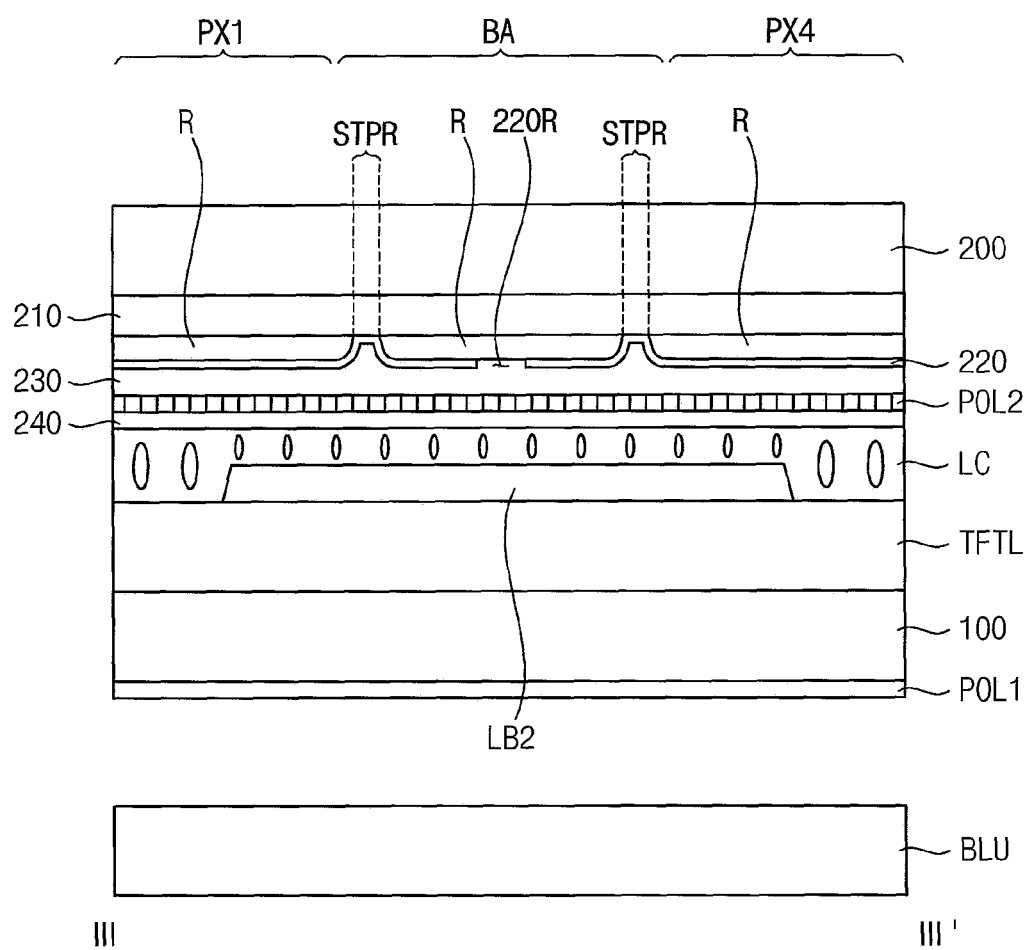
FIG. 3C is a cross-sectional view taken along a line III-III' of FIG. 2.

FIG. 2 is a plan view illustrating first to sixth pixels of the display apparatus of FIG. 1. FIG. 3A is a cross-sectional view taken along a line I-I' of FIG. 2. FIG. 3B is a cross-sectional view taken along a line II-II' of FIG. 2. FIG. 3C is a cross-sectional view taken along a line III-III' of FIG. 2.

Referring to FIGS. 2 to 3B, the first to sixth pixel areas (PX1 to PX6) of the display apparatus may be arranged in a matrix of 2 rows*3 columns along a first direction D1 and a second direction D2. The second direction D2 may be substantially perpendicular to the first direction D1. In the first to sixth pixel areas PX1 to PX6, light for displaying image may be emitted. Although red light is emitted from the first pixel area PX1 and the fourth pixel area PX4, green light is emitted from the second pixel area PX2 and the fifth pixel area PX5, and blue light is emitted from the third pixel area PX3 and the sixth pixel area PX6 in the present embodiment, the display apparatus according to embodiments of the present inventive concept is not limited thereto and may be variously configured. A light blocking area BA, which separates the pixel areas and blocks light, may be formed between the first to sixth pixel areas.

The display apparatus may include a photoluminescence apparatus, a liquid crystal layer LC, a second light blocking pattern LB2, a thin film transistor layer TFTL, a first base substrate 100, a first polarizer POL1 and a backlight unit BLU.

The photoluminescence apparatus may include an anti-reflection layer AR, a second base substrate 200, a first light blocking layer LB1, a blue light blocking layer 210, a first color conversion pattern R, a second color conversion pattern G, a third color conversion pattern B, a capping layer 220, a planarization layer 230, a second polarizer POL2, and an insulation layer 240.

The second base substrate 200 may include a transparent insulation substrate. For example, the second base substrate 200 may include a glass substrate, a quartz substrate, a transparent resin substrate, etc. Examples of the transparent resin substrate for the second base substrate 200 may include polyimide-based resin, acryl-based resin, polyacrylate-based resin, polycarbonate-based resin, polyether-based resin, sulfonic acid containing resin, polyethyleneterephtha-late-based resin, etc.

The anti-reflection layer AR may be disposed on the second base substrate 200. The anti-reflection layer AR reduces reflections due to internal structures of the display apparatus against external light, and may include a leaner polarizer and a ¼ wave retarder overlapped with the leaner polarizer.

The first light blocking layer LB1 may be disposed on the second base substrate 200. In a plan view, the first light blocking layer LB1 may extend in the second direction D2 and may be disposed between two pixel areas disposed adjacent to each other in the first direction D1. The first light blocking layer LB1 may include a material blocking light. For example, the first light blocking layer LB1 may be a metal black matrix and include metal.

Although not shown in the figures, a semi-transparent layer may be further disposed on the second base substrate 200. The semi-transparent layer may partially transmit and partially reflect light passing therethrough. The semi-transparent layer may include metal, such as silver Ag, and the like.

The blue light blocking pattern 210 may be disposed on the second base substrate 200 on which the first light blocking layer LB1 is disposed. In a plane view, the blue light blocking pattern 210 may be disposed in the first, second, fourth and fifth pixel areas PX1, PX2, PX4 and PX5. The blue light blocking pattern 210 may be formed by alternately laminating at least two layers having different refractive indices. Wavelength band of transmitted light excluding wavelength band of blue light is transmitted through the blue light blocking pattern 210, and the wavelength band of blue light is blocked by the blue light blocking pattern 210. The blue light, which is blocked by the blue light blocking pattern 210, may be reflected and optical recycled.

The first color conversion pattern R may be disposed on the blue light blocking pattern 210 in the first pixel area PX1 and the fourth pixel area PX4. The first color conversion pattern R may be red color conversion pattern. The first color conversion pattern R may convert blue light provided from the backlight unit BLU to red light. For example, the first color conversion pattern R may include a color conversion material, such as red quantum dot particles and/or red phosphor.

In a plan view, the first color conversion pattern R may extend from the first pixel area PX1 to the fourth pixel area PX4 in the second direction D2. Thus, the first color conversion pattern R may also be formed in the light blocking area BA between the first pixel area PX1 and the fourth pixel area PX4. The first color conversion pattern R may have a first stop pattern STPR in the light blocking area BA. In a plan view, the first stop pattern STPR may be formed adjacent to a first hole 220R of the capping layer 220, which will be mentioned later, and may extend in the first direction D1. The first stop pattern STPR may be an opening pattern formed in the first color conversion pattern R as a portion where the first color conversion pattern R is not formed. In a plan view, the first stop pattern STPR may include two patterns formed at equal distances from the first hole 220R along the second direction D2, and may be overlapped with the second light blocking pattern LB2.

A non-capped portion of the first color conversion pattern R may be exposed during the manufacturing process by the first hole 220R of the capping layer 220. The color conversion material of the first color conversion pattern R may be oxidized or changed by ligand desorption around the first hole 220R during the manufacturing process or after the manufacturing process, so that the color conversion material may be deteriorated. Accordingly, luminous efficiency of a portion of the first color conversion pattern R adjacent to the first hole 220R is lowered, so that display quality may be degraded. However, according to the present example, the portion of the first color conversion pattern R where deterioration occurred cannot spread anymore in the second direction D2 by the first stop pattern STPR, which is the opening pattern of the first color conversion pattern R. The portion of the first color conversion pattern R where deterioration occurred may spread along the first direction D1, which is an extension direction of the first stop pattern STPR. Thus, the portion deterioration occurred may be spread only in the first direction D1 in the light blocking area BA, and the first stop pattern STPR may prevent from spreading to the pixel area in the second direction D2. Accordingly, although the first hole 220R is formed, degradation of the display quality of the display apparatus due to deterioration of the first color conversion pattern R can be prevented.

The second color conversion pattern G may be disposed on the blue light blocking pattern 210 in the second pixel area PX2 and the fifth pixel area PX5. The second color conversion pattern G may be a green color conversion pattern. The second color conversion pattern G may convert blue light provided from the backlight unit BLU to green light. For example, the second color conversion pattern G may include a color conversion material, such as green quantum dot particles and/or green phosphor.

In a plan view, the second color conversion pattern G may extend from the second pixel area PX2 to the fifth pixel area PX5 in the second direction D2. Thus, the second color conversion pattern G may also be formed in the light blocking area BA between the second pixel area PX2 and the fifth pixel area PX5. The second color conversion pattern G may have a second stop pattern STPG in the light blocking area BA. In a plan view, the second stop pattern STPG may be formed adjacent to a second hole 220G of the capping layer 220, which will be mentioned later, and may extend in the first direction D1. The second stop pattern STPG may be an opening pattern formed in the second color conversion pattern G as a portion where the second color conversion pattern G is not formed. In a plan view, the second stop pattern STPG may include two patterns formed at equal distances from the second hole 220G along the second direction D2, and may be overlapped with the second light blocking pattern LB2.

The third color conversion pattern B may be disposed on the second base substrate 200 in the third pixel area PX3 and the sixth pixel area PX6. The third color conversion pattern B may include scattering particles that change traveling direction of the blue light without changing wavelength of the wavelength band of blue light provided by the backlight unit BLU. The scattering particles may be particles of TiO2 or the like, and size of the scattering particles may be similar to the size of the red quantum dot particles or the green quantum dot particles. In addition, the third color conversion pattern B may further include a blue pigment for converting light passing therethrough to blue light.

Although the first color conversion pattern R, the second color conversion pattern G and the third color conversion pattern B are repeatedly disposed in the second direction D2 to form stripe shapes in the present embodiment, arrangement structure of the color conversion patterns is not limited thereto and may be variously modified.

The capping layer 220 may be disposed on the first color conversion pattern R, the second color conversion pattern G and the third color conversion pattern B. The capping layer 220 may cover the first color conversion pattern R, the second color conversion pattern G and the third color conversion pattern B for capping. The first hole 220R, the second hole 220G and the third hole 220B may be formed through the capping layer 220. Although each of the first to third holes 220R, 220G and 220B has a square shape, it is not limited thereto and may be variously modified. For example, each of the first to third holes 220R, 220G and 220B may have a shape of circle, ellipse, triangle, star, etc. The first to third holes 220R, 220G and 220B may be disposed at a center of the light blocking area BA in the second direction D2. Thus, a distance from the first hole 220R to both edges of the second light blocking member LB2 can be maximized. Accordingly, even if a part of the first color conversion pattern R is deteriorated, influence of the deterioration to the first or fourth pixel areas PX1 or PX4 can be minimized.

Here, the first to third color conversion patterns R, G and B may be formed by a process at a temperature of 180 (Celsius degree) or less to enhance luminous efficiency. Accordingly, even after a curing process of solvent containing the color conversion material, an uncured solvent may remain, and an active unfilled area (AUA) defect due to out-gassing may be caused. In the present embodiment, out-gas generated in the first to third color conversion patterns R, G, and B may flow out through the first to third holes 220R, 220G, and 220B. Thus, AUA defects may be reduced.

The capping layer 220 may be a light recycling filter. For example, the capping layer 220 may be a yellow light recycling filter. The light recycling filter may reflect light generated from the backlight unit BLU and reflected by the first to third color conversion patterns R, G, and B, and the blue light blocking pattern 210 toward the liquid crystal layer LC, thereby improving brightness of the display apparatus.

The planarization layer 230 may be disposed on the capping layer 220. The planarization layer 230 may be planarized on an upper surface of the capping layer 220, and may include organic or inorganic insulation material.

The second polarizer POL2 may be disposed on the planarization layer 230. The second polarizer POL2 may be a wire grid polarizer. The wire grid polarizer may include a plurality of fine lines extending in one direction, which are formed of metal and are arranged at regular intervals. The fine lines may have a pitch of about 50 nm (nanometer) to 150 nm. The pitch refers to sum of a width of one fine line and a distance between adjacent fine lines.

The insulation layer 240 may be disposed on the second polarizer POL2 to cover the second polarizer POL2 for capping. The insulation layer 240 may include organic or inorganic insulation material.

In addition, the photoluminescence apparatus may further include a common electrode on the insulation layer 240 according to a driving mode of the display apparatus.

The first base substrate 100 may include a transparent insulation substrate. For example, the first base substrate 100 may include a glass substrate, a quartz substrate, a transparent resin substrate, etc. Examples of the transparent resin substrate for the first base substrate 100 may include polyimide-based resin, acryl-based resin, polyacrylate-based resin, polycarbonate-based resin, polyether-based resin, sulfonic acid containing resin, polyethyleneterephthalate-based resin, etc.

The thin film transistor layer TFTL may be disposed on the first base substrate. Although not shown in detail in the figures, the thin film transistor layer TFTL may include a signal line, such as a gate line and a data line, for driving the display apparatus and a thin film transistor including a gate electrode, an active pattern, a source electrode and a drain electrode and electrically connected to the signal line. The thin film transistor may be electrically connected to the pixel electrode, and the thin film transistor and the pixel electrode may be formed to correspond to the respective pixel areas (the first to sixth pixel areas). For example, the thin film transistor may be formed by overlapping the light blocking area (for example, the second light blocking pattern LB2) adjacent to the first pixel area PX1. The pixel electrode connected to the thin film transistor may be formed in the first pixel area PX1.

The second light blocking pattern LB2 may be disposed on the second base substrate 200. The second light blocking pattern LB2 may include a material blocking light. In a plan view, the second light blocking pattern LB2 may be extended in the first direction D1, and may be formed in the light blocking area BA. The second light blocking pattern LB2 may be overlapped with the first hole 220R of the capping layer 220, the first stop pattern STPR, the second hole 220G, the second stop pattern STPG, the third hole 220B and the third stop pattern STPB. In addition, the second light blocking pattern LB2 may overlap the thin film transistor.

The first polarizer POL1 may be disposed on the first base substrate 100. The first polarizer POL1 may be an absorption type polarizing plate, such as a general polyvinyl alcohol (PVA) polarizing plate, or a reflection type polarizing plate, such as a wire grid polarizing element.

The liquid crystal layer LC may be disposed between the insulation layer 240 and the thin film transistor layer TFTL. The liquid crystal layer LC may include liquid crystal molecules having optical anisotropy. The liquid crystal molecules are driven by electric field, so that an image is displayed by passing or blocking light through the liquid crystal layer LC. Although not shown in the figures, the display apparatus may further include alignment layers disposed above and below the liquid crystal layer LC.

The back light unit BLU may be disposed under the first base substrate 100 to provide light to the liquid crystal layer LC. More particularly, the backlight unit BLU may generate blue light in a blue wavelength band to provide the blue light to the liquid crystal layer LC direction.

According to the present embodiment, the first hole is formed in the capping layer of the display apparatus, so that the AUA defect due to the out-gas generated in the first color conversion pattern can be reduced. The first spot pattern is formed in the first color conversion pattern. Therefore, even if a part of the first color conversion pattern around the first hole is deteriorated, since the deteriorated portion of the first color conversion pattern is formed only in the light blocking area, display quality degradation due to the deterioration of the first color conversion pattern can be prevented.

Figure 4:
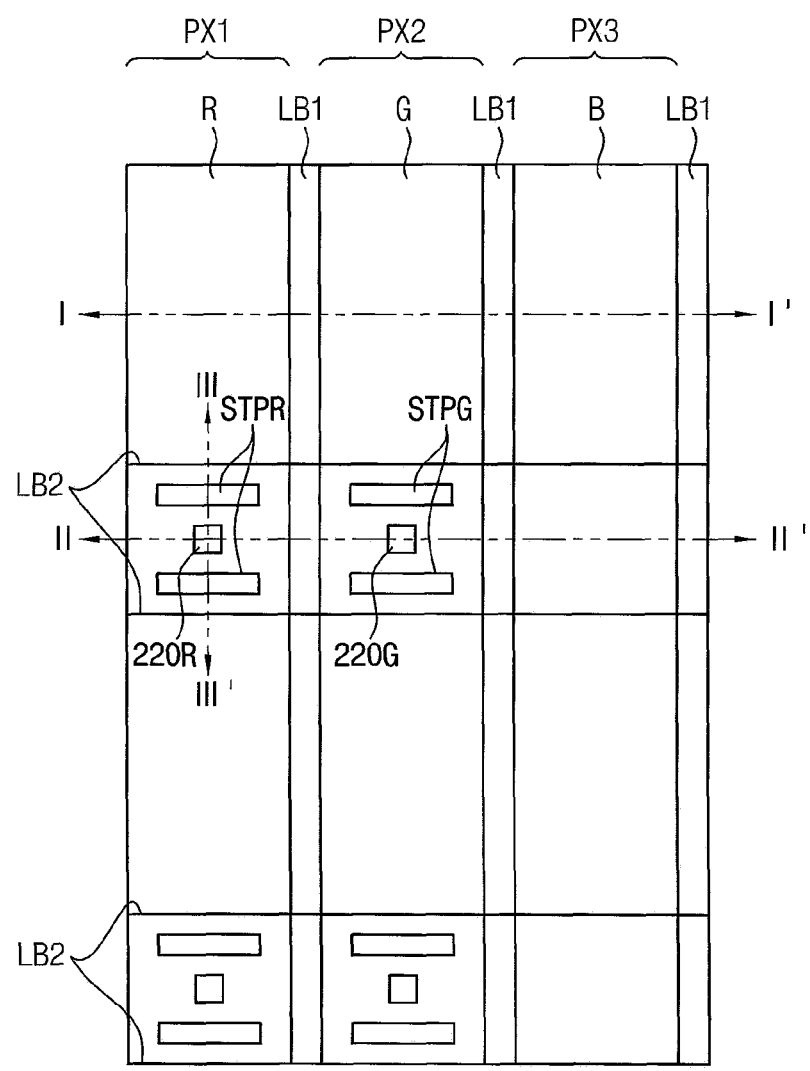
FIG. 4 is a plan view illustrating pixel areas of a portion of a display apparatus according to an example embodiment of the inventive concept.
Figure 5A:
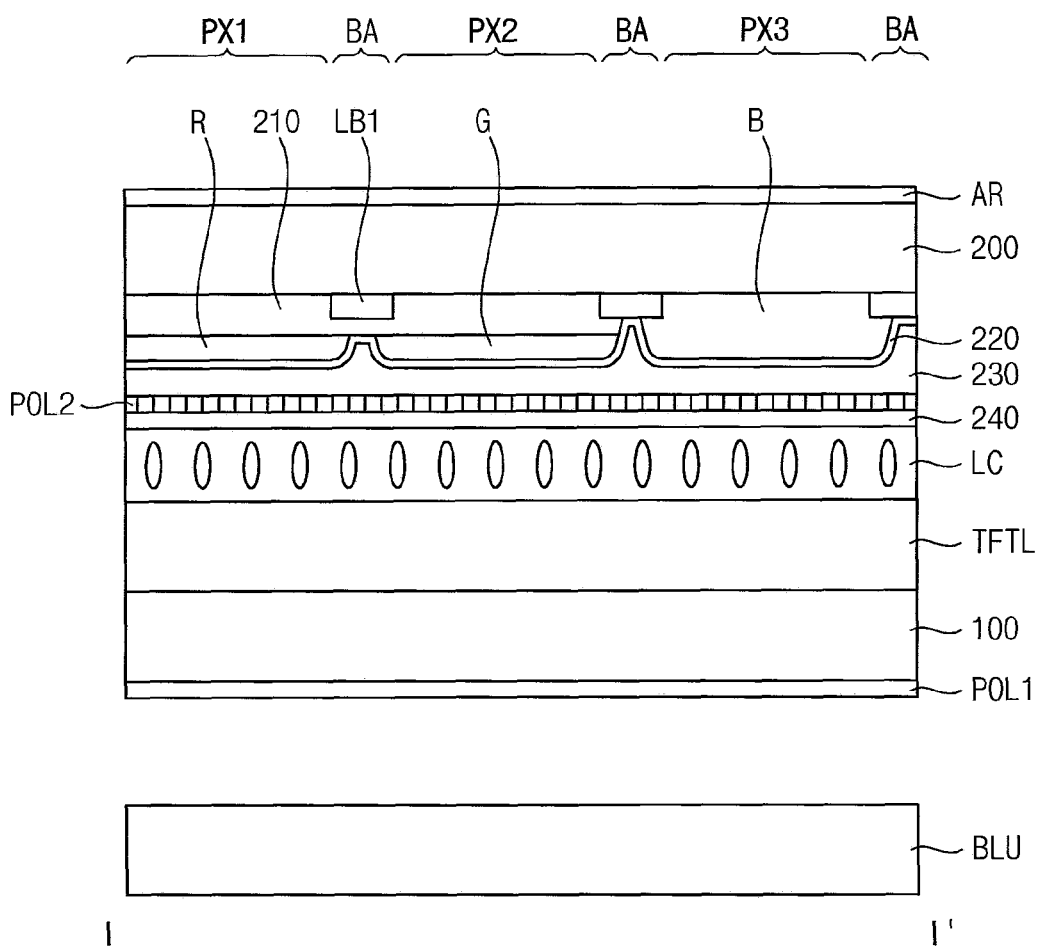
FIG. 5A is a cross-sectional view taken along a line I-I' of FIG. 4.
Figure 5B:
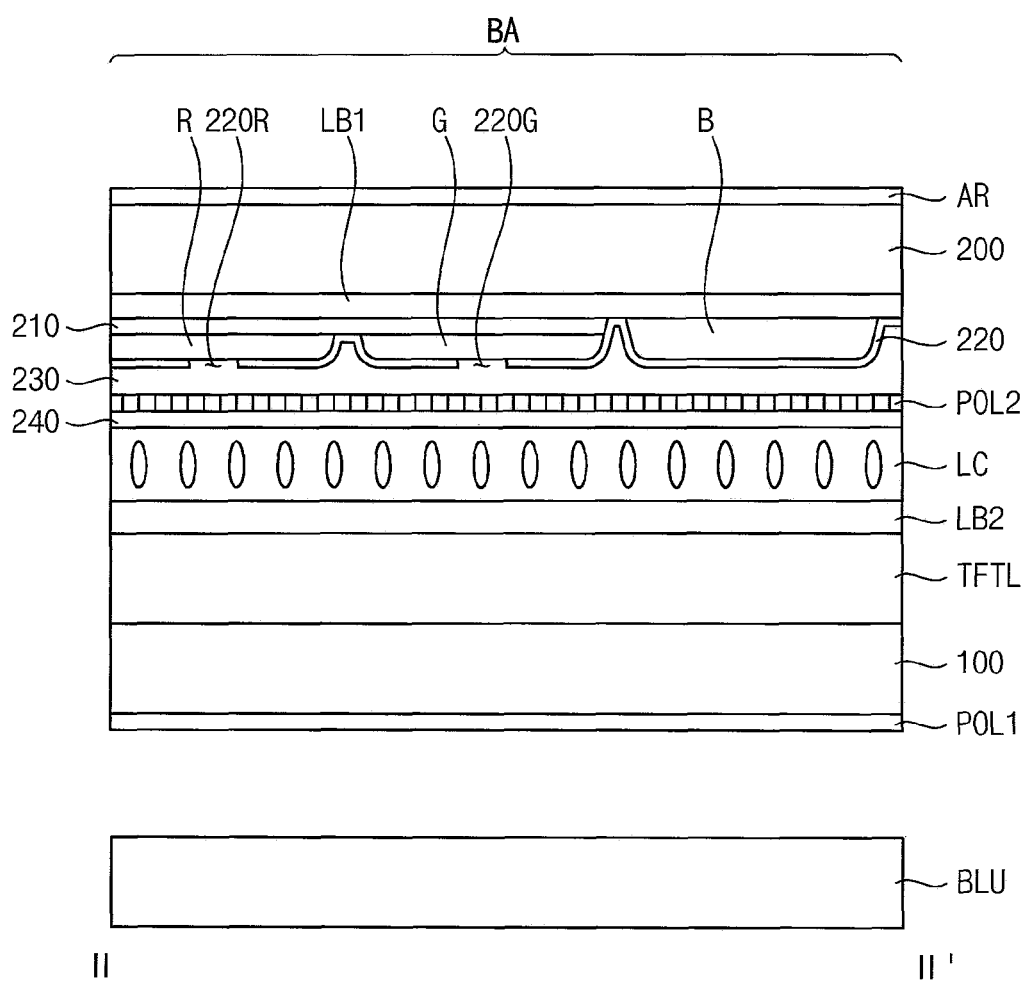
FIG. 5B is a cross-sectional view taken along a line II-II' of FIG. 4.
Figure 5C:
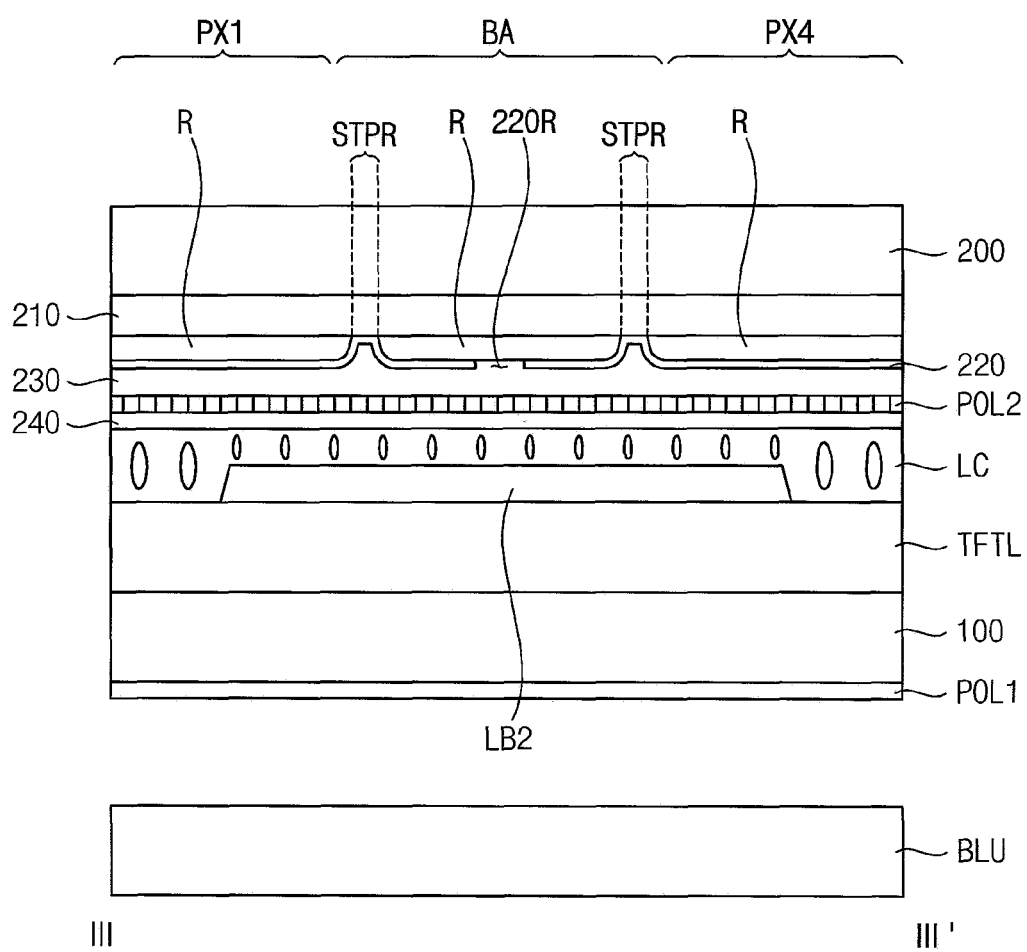
FIG. 5C is a cross-sectional view taken along a line III-III' of FIG. 4.

FIG. 4 is a plan view illustrating pixel areas of a portion of a display apparatus according to an example embodiment of the inventive concept. FIG. 5A is a cross-sectional view taken along a line I-I' of FIG. 4. FIG. 5B is a cross-sectional view taken along a line II-II' of FIG. 4. FIG. 5C is a cross-sectional view taken along a line III-III' of FIG. 4.

Referring to FIGS. 4 to 5C, the display apparatus may be substantially the same as the display apparatus of FIG. 2, except that a third stop pattern is not formed in a third color conversion pattern, and a third hole is not formed in a capping layer. Thus, any further detailed descriptions concerning the same elements will be omitted.

First to sixth pixel areas PX1 to PX6 of the display apparatus may be arranged in a 2 rows*3 columns matrix form in a first direction D1 and a second direction D2. A light blocking area BA that separates the pixel areas may be formed between the first to sixth pixel areas.

The display apparatus may include a photoluminescence apparatus, a liquid crystal layer LC, a second light blocking pattern LB2, a thin film transistor layer TFTL, a first base substrate 100, a first polarizer POL1 and a backlight unit BLU.

The photoluminescence apparatus may include an anti-reflection layer AR, a second base substrate 200, a first light blocking layer LB1, a blue light blocking layer 210, a first color conversion pattern R, a second color conversion pattern G, a third color conversion pattern B, a capping layer 220, a planarization layer 230, a second polarizer POL2, and an insulation layer 240.

The third color conversion pattern B may be disposed on the second base substrate 200 in the third pixel area PX3 and the sixth pixel area PX6. The third color conversion pattern B may include scattering particles. The third color conversion pattern B may further include blue pigment. A stop pattern is not formed in the third color conversion pattern B, unlike the first and second color conversion patterns R and G.

A first hole 220R overlapping the first color conversion pattern R and a second hole 220G overlapping the second color conversion pattern G may be formed through the capping layer 220. Unlike the embodiment of FIG. 2, a hole corresponding to the third color conversion pattern B is not formed.

Unlike the first or second color conversion pattern R or G, the third color conversion pattern B does not include a quantum dot or a fluorescent material. In addition, the third color conversion pattern B is formed to be transparent so that the blue light of the backlight unit BLU passes therethrough in the third and sixth pixel areas PX3 and PX6. Thus, effect of the third color conversion pattern B degradation on display quality degradation may be small. Thus, the hole and the stop pattern may not be formed corresponding to the third color conversion pattern B.

Figure 6:
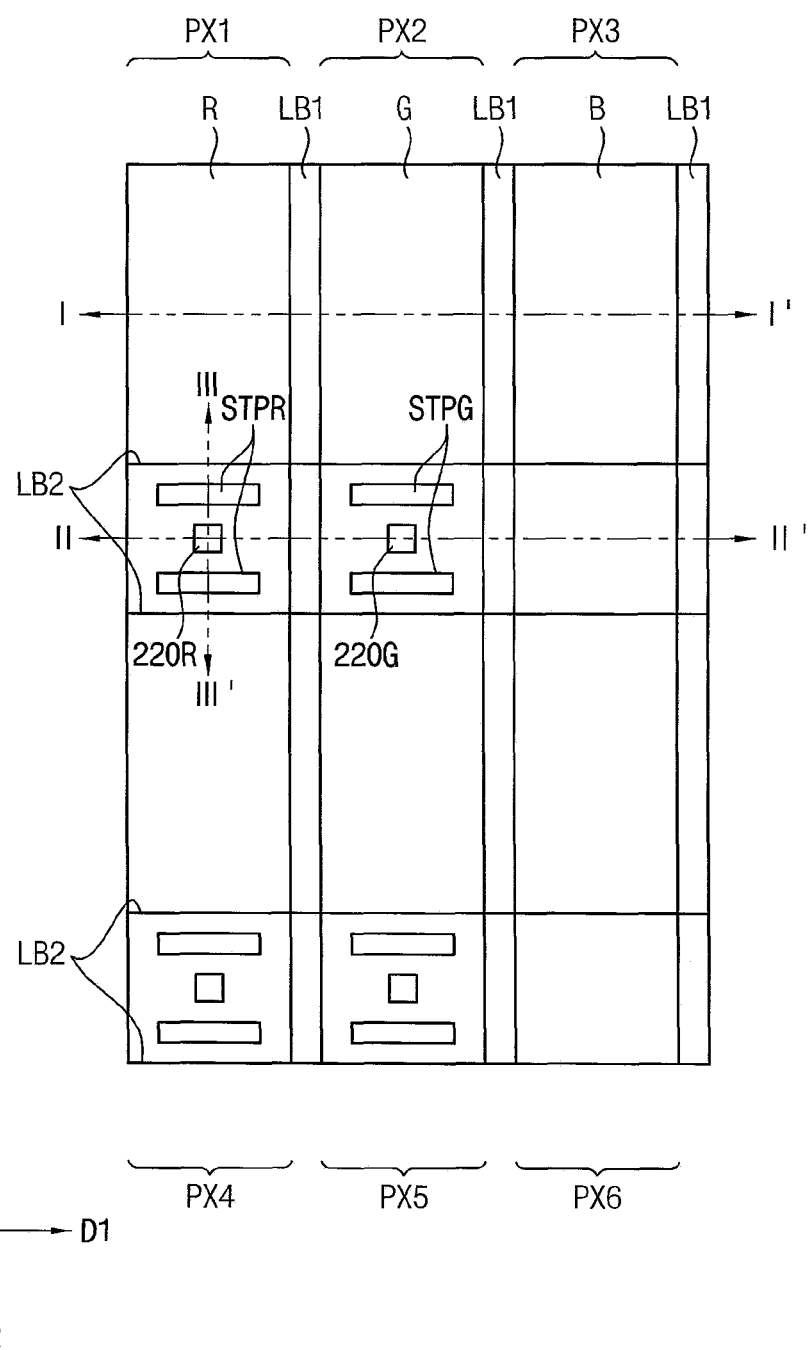
FIG. 6 is a plan view illustrating pixel areas of a portion of a display apparatus according to an example embodiment of the inventive concept.
Figure 7A:
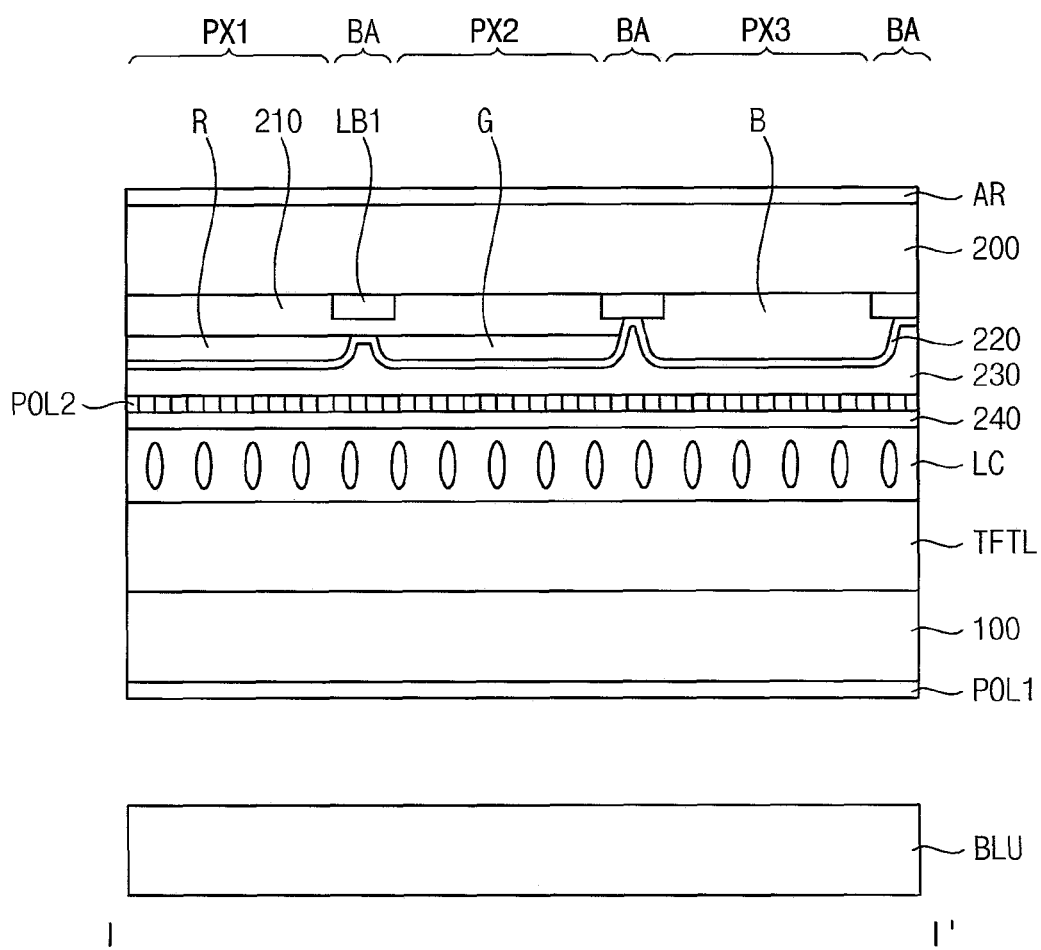
FIG. 7A is a cross-sectional view taken along a line I-I' of FIG. 6.
Figure 7B:
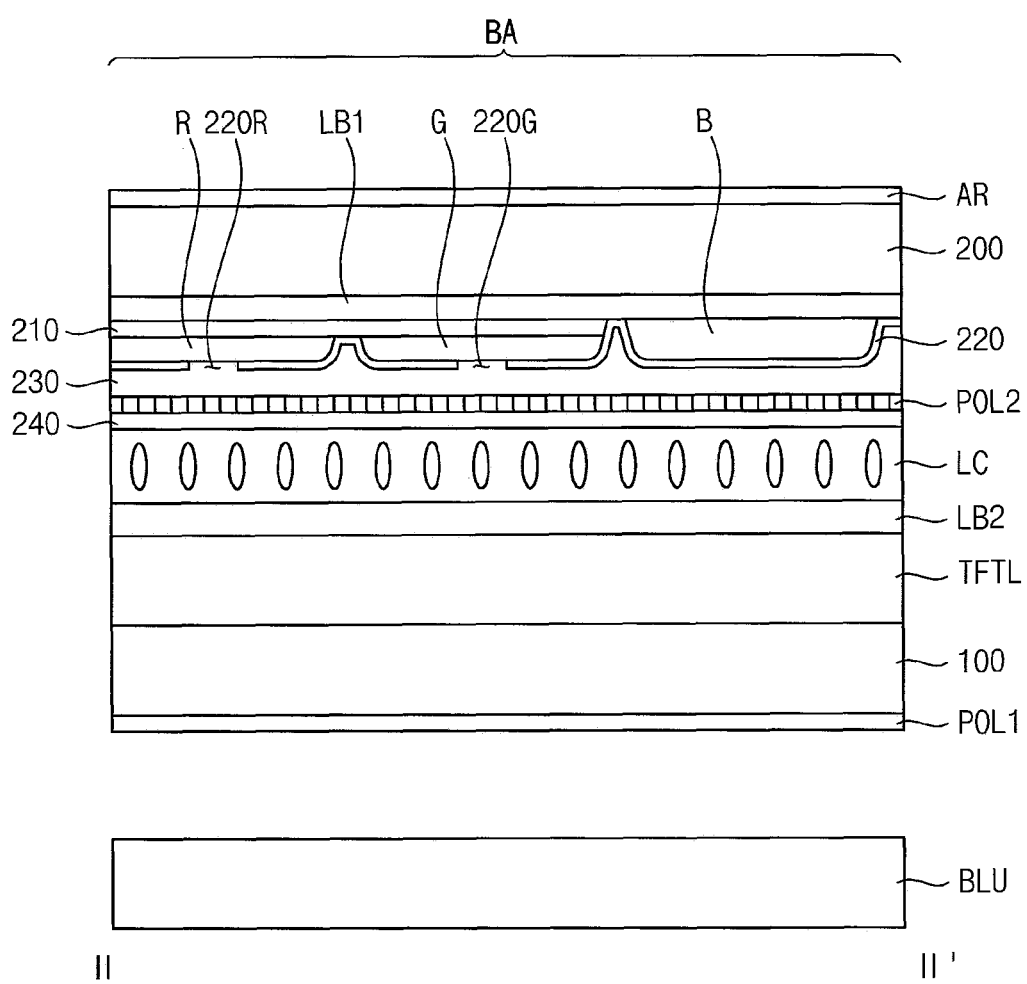
FIG. 7B is a cross-sectional view taken along a line II-II' of FIG. 6.
Figure 7C:
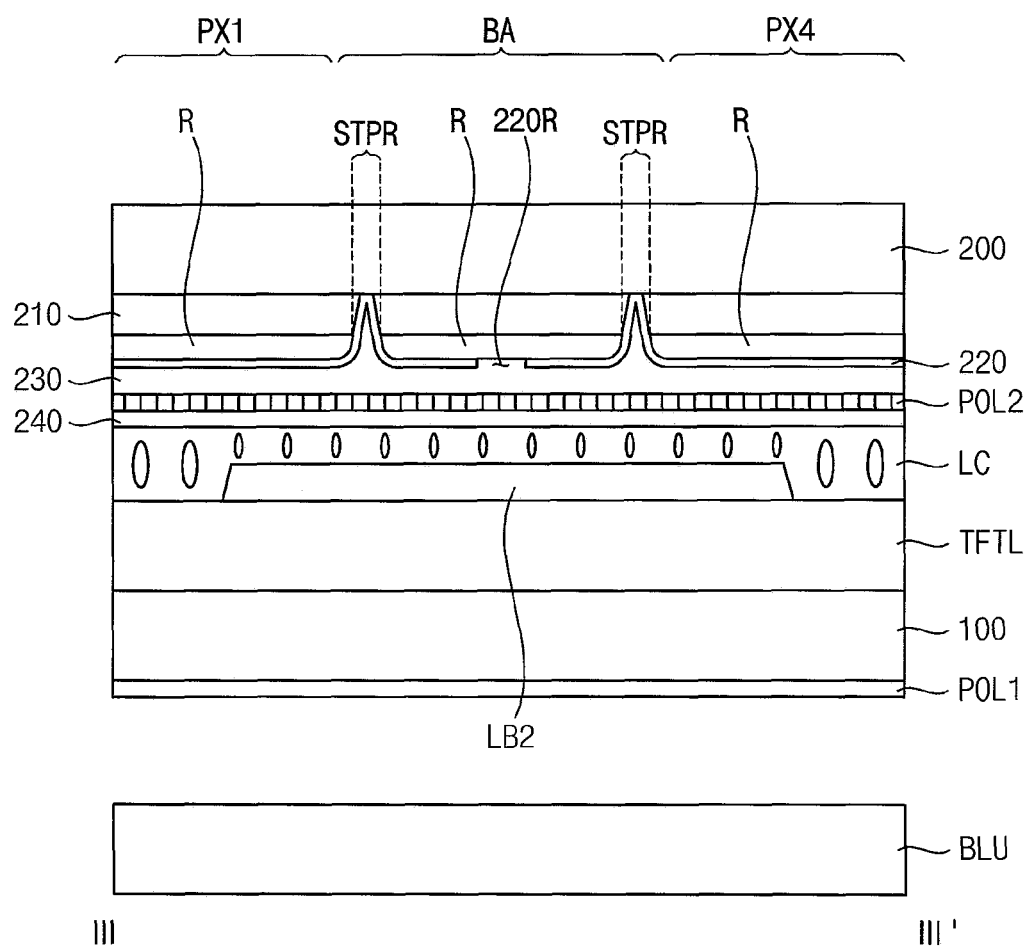
FIG. 7C is a cross-sectional view taken along a line III-III' of FIG. 6.

FIG. 6 is a plan view illustrating pixel areas of a portion of a display apparatus according to an example embodiment of the inventive concept. FIG. 7A is a cross-sectional view taken along a line I-I' of FIG. 6. FIG. 7B is a cross-sectional view taken along a line II-II' of FIG. 6. FIG. 7C is a cross-sectional view taken along a line III-III' of FIG. 6.

Referring to FIGS. 6, 7A, 7B and 7C, the display apparatus may be substantially the same as the display apparatus of FIG. 4, except that a first spot pattern STPR and a second top pattern STPG are formed in a blue light blocking layer 210. Thus, any further detailed descriptions concerning the same elements will be omitted.

A first stop pattern STPR may be formed at a first color conversion pattern R. The first stop pattern STPR may be disposed in a light blocking area BA. The first stop pattern STPR may be an opening pattern formed in the first color conversion pattern R as a portion where the first color conversion pattern R is not formed. In addition, the opening pattern may be formed through the blue light blocking pattern 210 under the first color conversion pattern R. Thus, corresponding to the first stop pattern STPR, the opening pattern may be formed at the first color conversion pattern R, and the opening pattern may also be formed through the blue light blocking pattern 210.

A second stop pattern STPG may be formed at a second color conversion G The second stop pattern STPG may be disposed in the light blocking area BA. The second stop pattern STPG may be an opening pattern formed in the second color conversion pattern G as a portion where the second color conversion pattern G is not formed. In addition, the opening pattern may be formed through the blue light blocking pattern 210 under the second color conversion pattern G. Thus, corresponding to the second stop pattern STPG, the opening pattern may be formed at the second color conversion pattern G, and the opening pattern may also be formed through the blue light blocking pattern 210.

The capping layer 220 may cover the first color conversion pattern R and the second color conversion pattern G. Here, the capping layer 220 may make contact with the blue light blocking pattern 210 and the base substrate 200 through the first and second stop patterns STPR and STPG in a portion where the first and second stop patterns STPR and STPG are formed.

Figure 8:
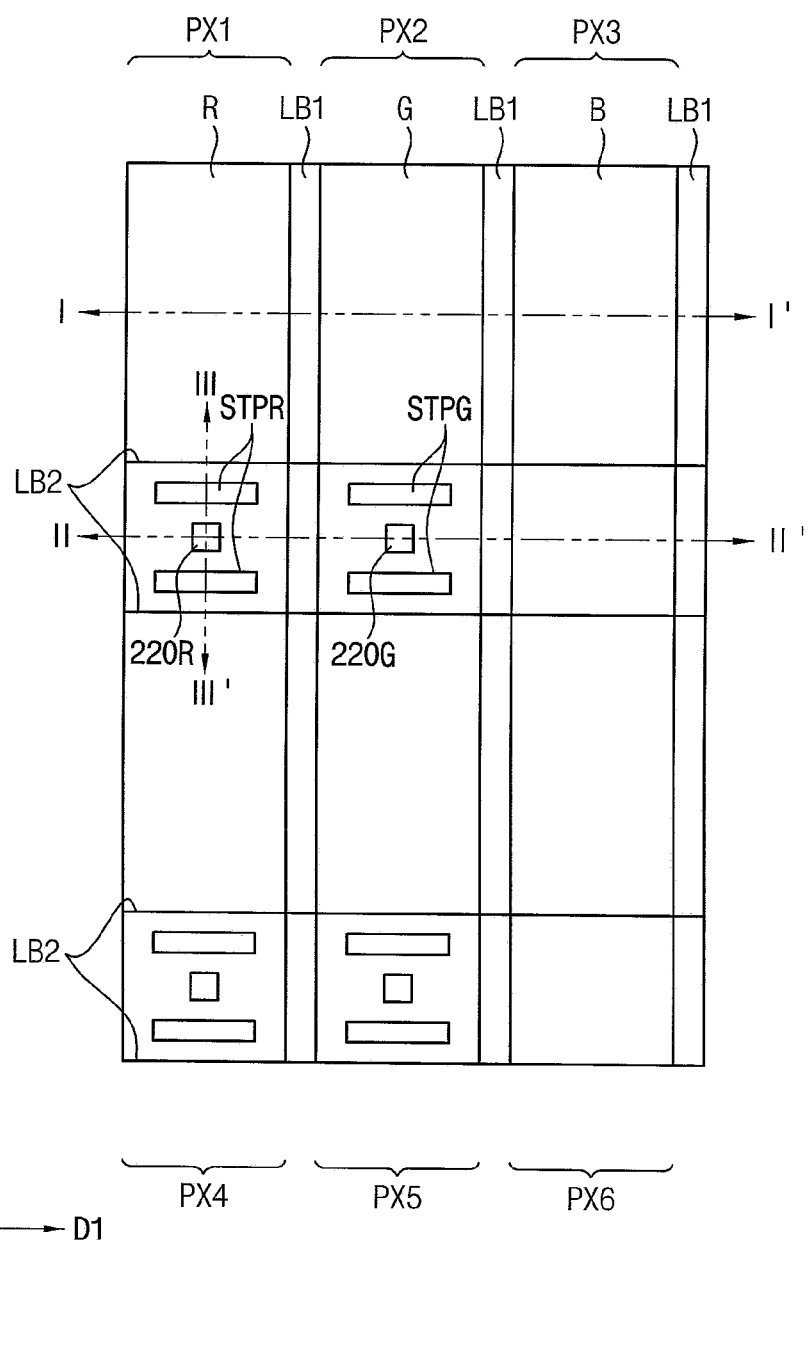
FIG. 8 is a plan view illustrating pixel areas of a portion of a display apparatus according to an example embodiment of the inventive concept.
Figure 9A:
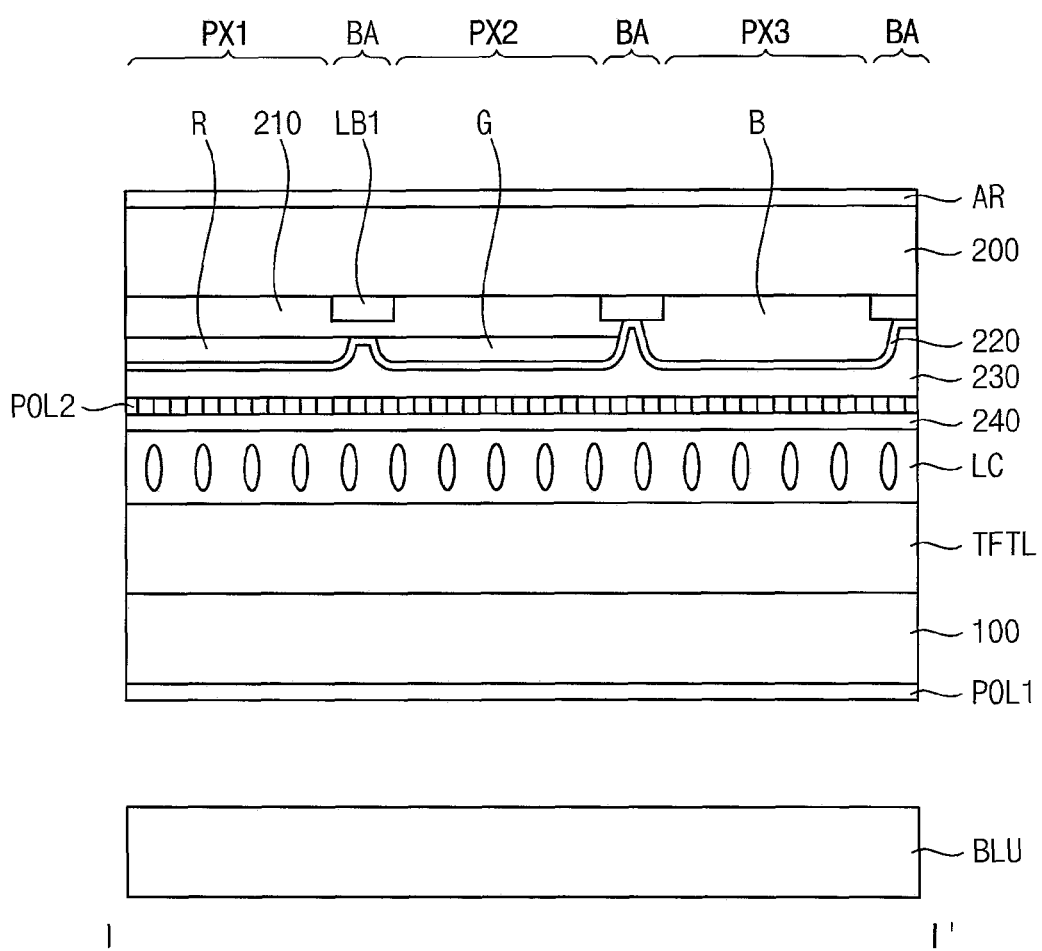
FIG. 9A is a cross-sectional view taken along a line I-I' of FIG. 8.
Figure 9B:
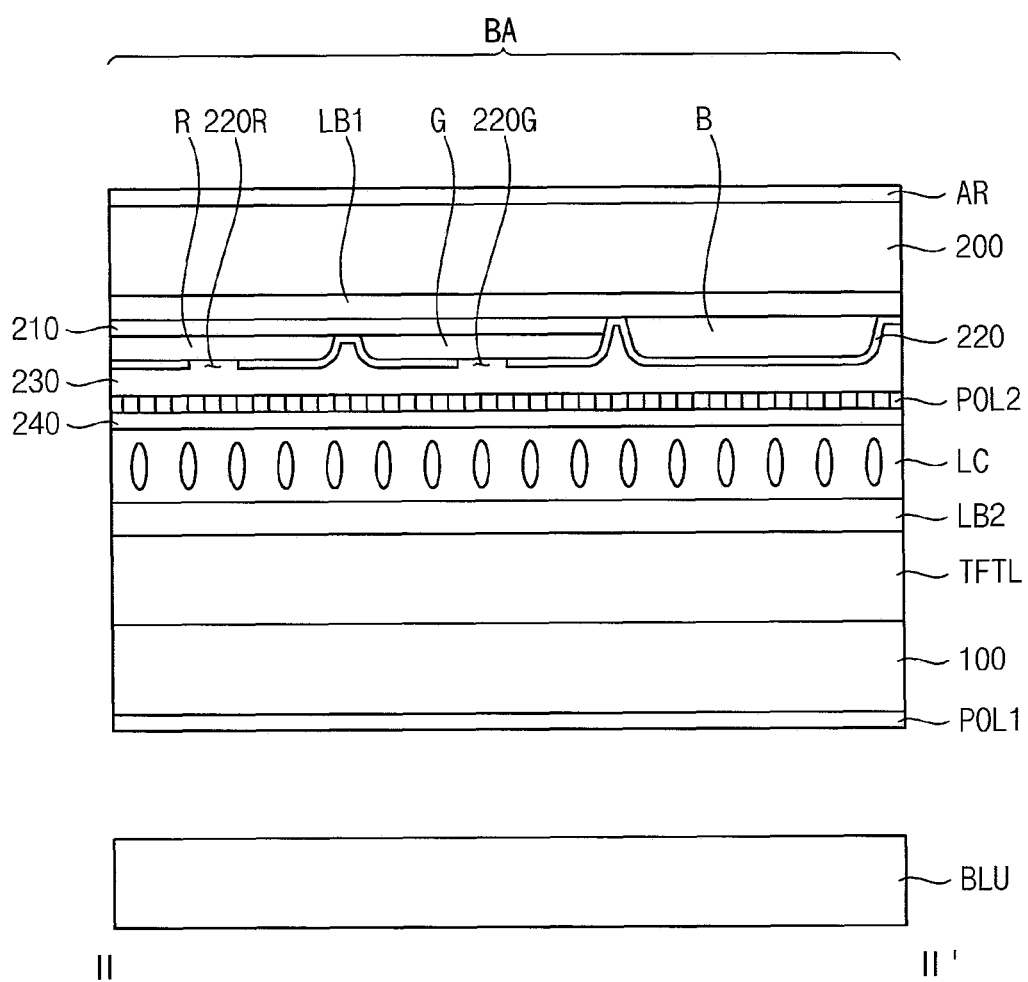
FIG. 9B is a cross-sectional view taken along a line II-II' of FIG. 8.
Figure 9C:
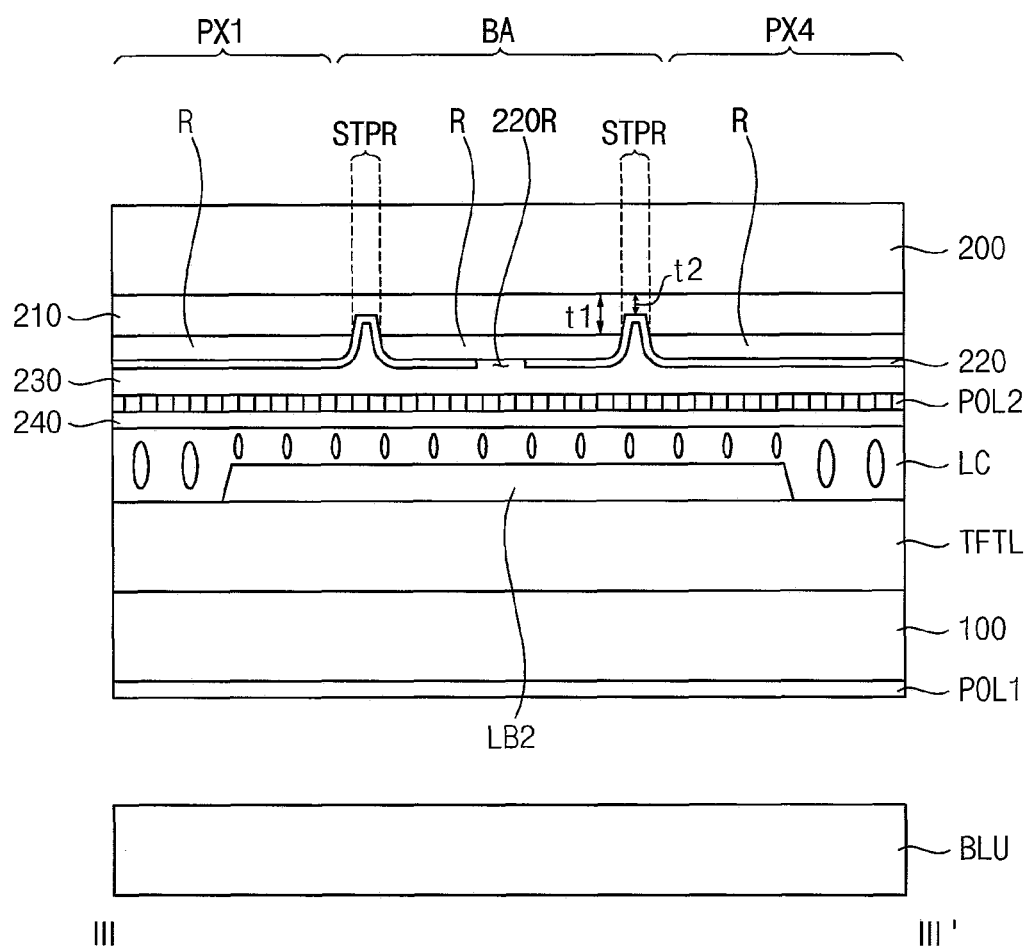
FIG. 9C is a cross-sectional view taken along a line III-III' of FIG. 8.

FIG. 8 is a plan view illustrating pixel areas of a portion of a display apparatus according to an example embodiment of the inventive concept. FIG. 9A is a cross-sectional view taken along a line I-I' of FIG. 8. FIG. 9B is a cross-sectional view taken along a line II-II' of FIG. 8. FIG. 9C is a cross-sectional view taken along a line III-III' of FIG. 8;

Referring to FIGS. 8 to 9C, the display apparatus may be substantially the same as the display apparatus of FIG. 6, except that a first stop pattern STPR and a second stop pattern STPG are formed through a portion of a blue light blocking pattern 210. Thus, any further detailed descriptions concerning the same elements will be omitted.

A first stop pattern STPR may be formed at a first color conversion pattern R. The first stop pattern STPR may be disposed in a light blocking area BA. The first stop pattern STPR may be an opening pattern formed in the first color conversion pattern R as a portion where the first color conversion pattern R is not formed. In addition, the opening pattern may be formed through a portion of the blue light blocking pattern 210 (e.g., formed partially through a thickness of the blue light blocking pattern 210 under the first color conversion pattern R. Thus, corresponding to the first stop pattern STPR, the opening pattern may be formed at the first color conversion pattern R, and a groove corresponding to the opening pattern may be formed in the blue light blocking pattern 210. Accordingly, the blue light blocking pattern 210 may have a second thickness t2 at the first stop pattern STPR and have a first thickness t1 thicker than the second thickness t2 in other portion.

A second stop pattern STPG may be formed at a second color conversion G. The second stop pattern STPG may be disposed in the light blocking area BA. The second stop pattern STPG may be an opening pattern formed in the second color conversion pattern G as a portion where the second color conversion pattern G is not formed. In addition, the opening pattern may be formed through a portion of the blue light blocking pattern 210 under the second color conversion pattern G. Thus, corresponding to the second stop pattern STPG, the opening pattern may be formed at the second color conversion pattern G, and a groove corresponding to the opening pattern may be formed at the blue light blocking pattern 210. Accordingly, the blue light blocking pattern 210 may have a second thickness t2 at the second stop pattern STPG and have a first thickness t1 thicker than the second thickness t2 in other portion.

The capping layer 220 may cover the first color conversion pattern R and the second color conversion pattern G. Here, the capping layer 220 may make contact with the blue light blocking pattern 210 through the first and second stop patterns STPR and STPG in a portion where the first and second stop patterns STPR and STPG are formed.

Figure 10:
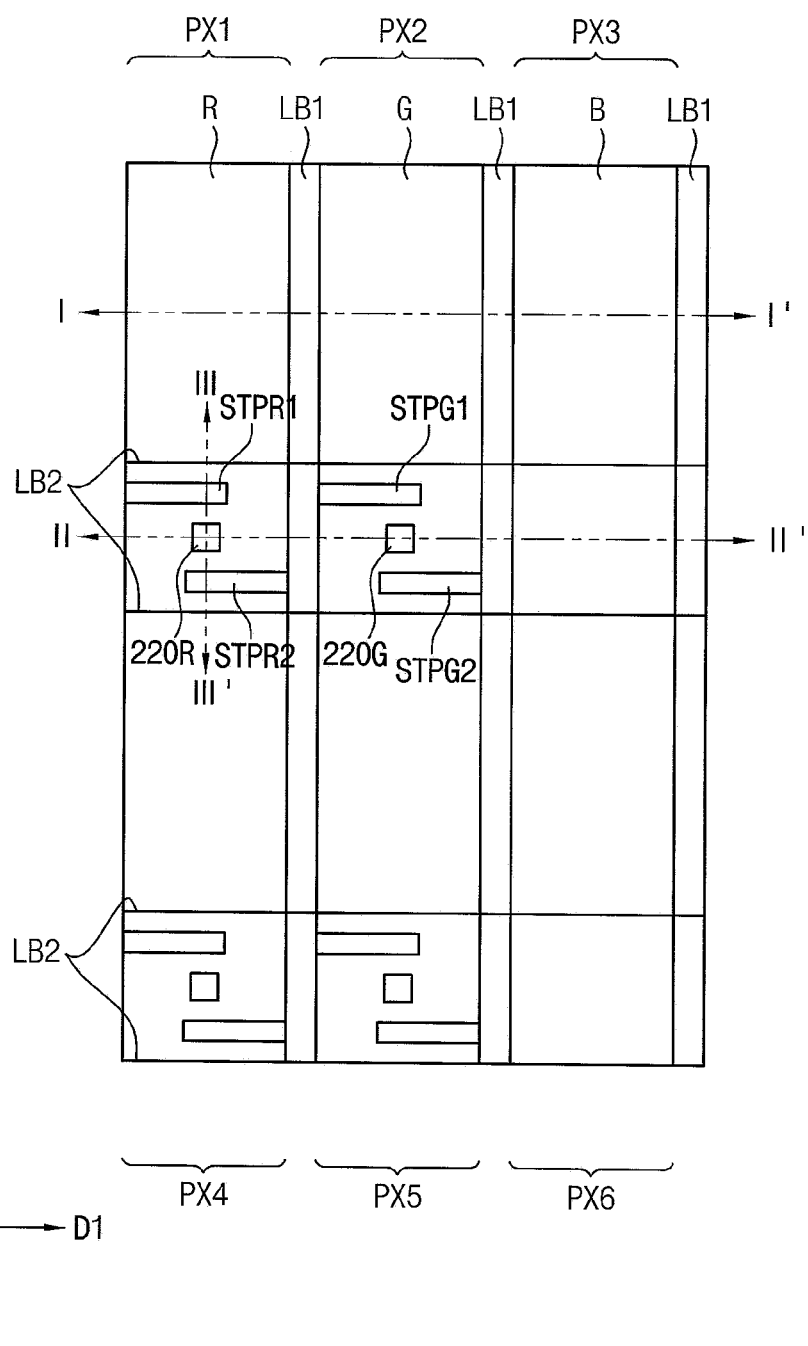
FIG. 10 is a plan view illustrating pixel areas of a portion of a display apparatus according to an example embodiment of the inventive concept.
Figure 11A:
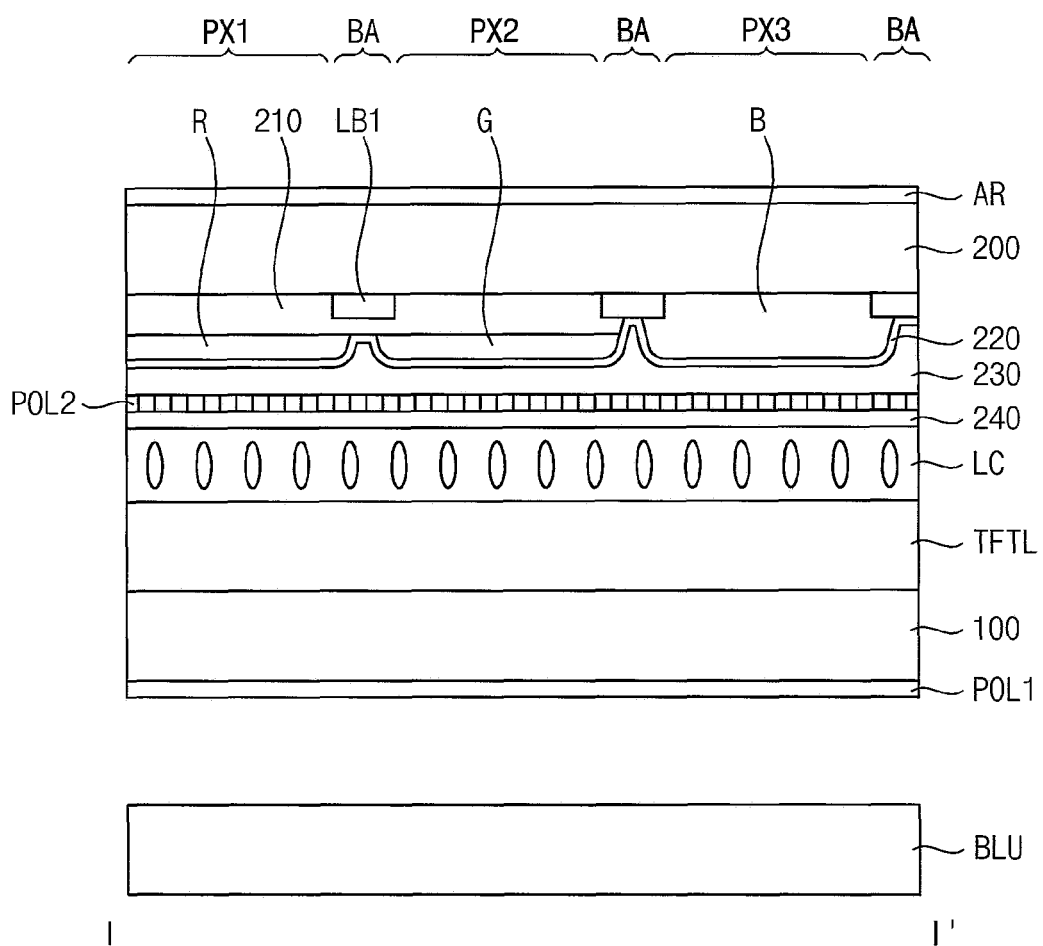
FIG. 11A is a cross-sectional view taken along a line I-I' of FIG. 10.
Figure 11B:
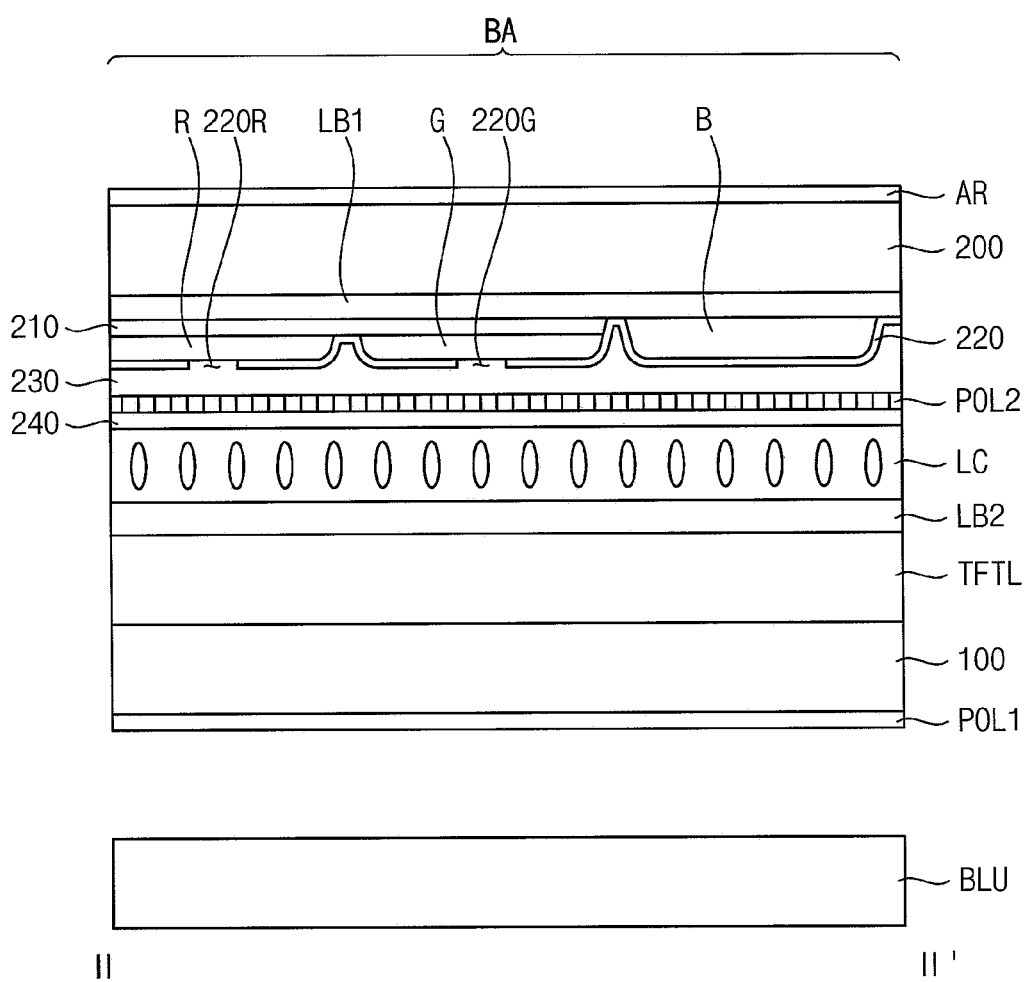
FIG. 11B is a cross-sectional view taken along a line II-II' of FIG. 10.
Figure 11C:
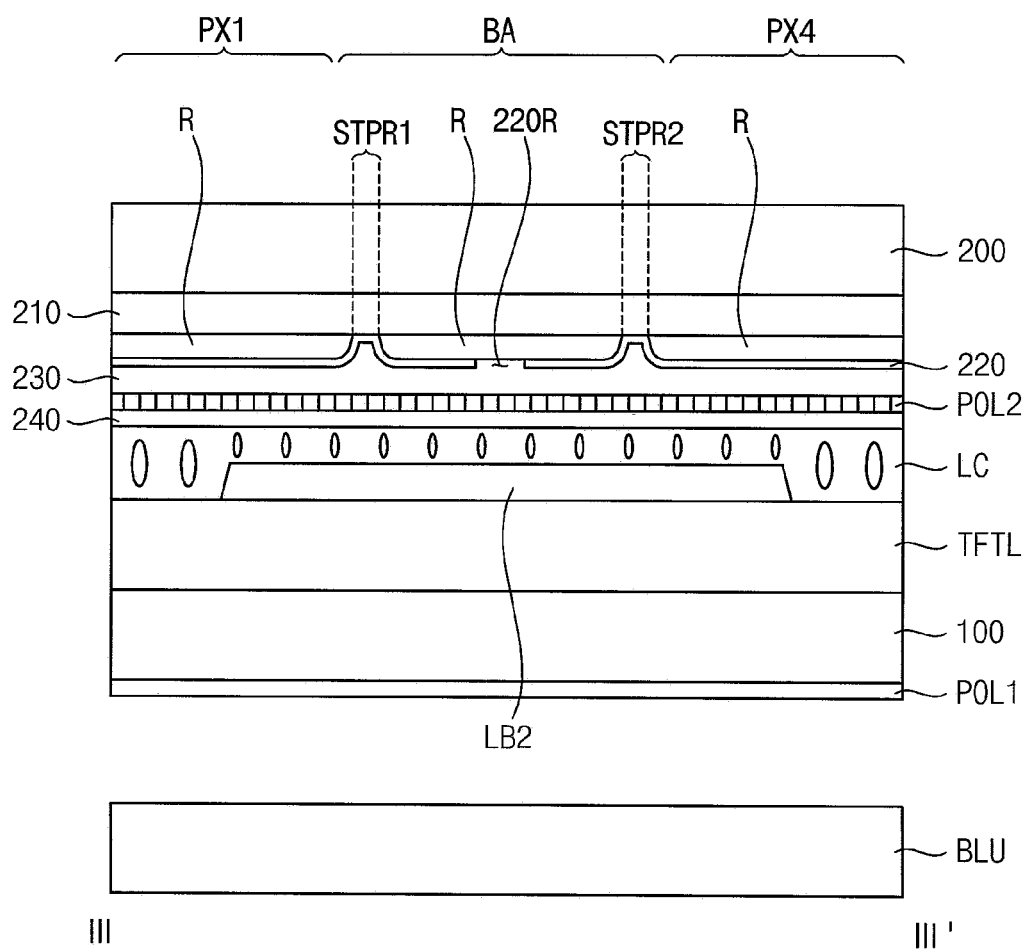
FIG. 11C is a cross-sectional view taken along a line III-III' of FIG. 10.

FIG. 10 is a plan view illustrating pixel areas of a portion of a display apparatus according to an example embodiment of the inventive concept. FIG. 11A is a cross-sectional view taken along a line I-I' of FIG. 10. FIG. 11B is a cross-sectional view taken along a line II-II' of FIG. 10. FIG. 11C is a cross-sectional view taken along a line III-III' of FIG. 10;

Referring to FIGS. 10 to 11C, the display apparatus may be substantially the same as the display apparatus of FIG. 4, except a shape of first stop pattern STPR1 and STPR2 and a shape of second stop pattern STPG1 and STPG2. Thus, any further detailed descriptions concerning the same elements will be omitted.

The first stop pattern may include a 1A stop pattern STPR1 and a 1B stop pattern STPR2. The 1A stop pattern STPR1 may extend to a first edge of a first color conversion pattern R. The 1B stop pattern STPR2 may extend to a second edge of the first color conversion pattern R that is opposite to the first edge in a first direction D1. Thus, when the first stop pattern is opening, the edge of the first color conversion pattern R may be opened.

In a plan view, each of the 1A stop pattern STPR1 and the 1B stop pattern STPR2 is connected to one edge of the first color conversion pattern R, so that the first color conversion pattern R may be continuously formed in a second direction D2.

The second stop pattern may include a 2A stop pattern STPG1 and a 2B stop pattern STPG2. The 2A stop pattern STPG1 and the 2B stop pattern STPG2 may be similarly formed as that of the first color conversion pattern R.

Figure 13A:
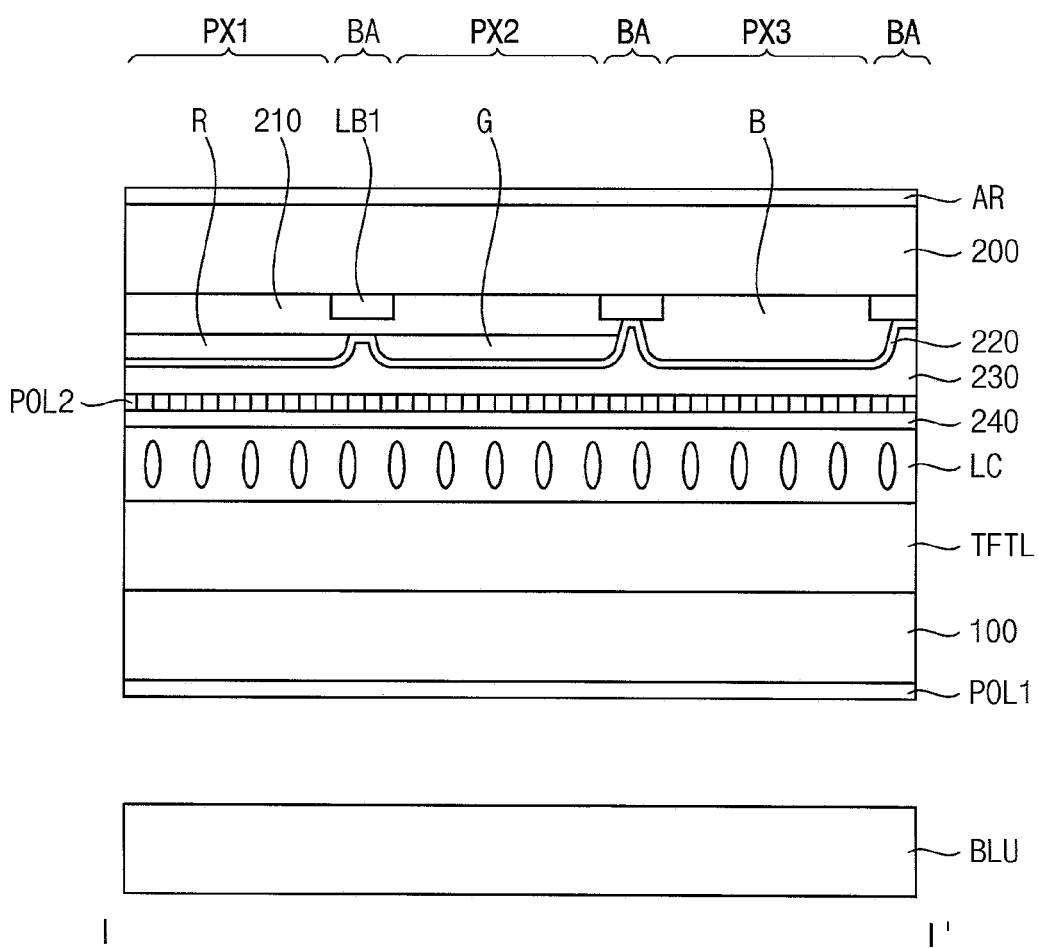
FIG. 13A is a cross-sectional view taken along a line I-I' of FIG. 12.
Figure 13B:
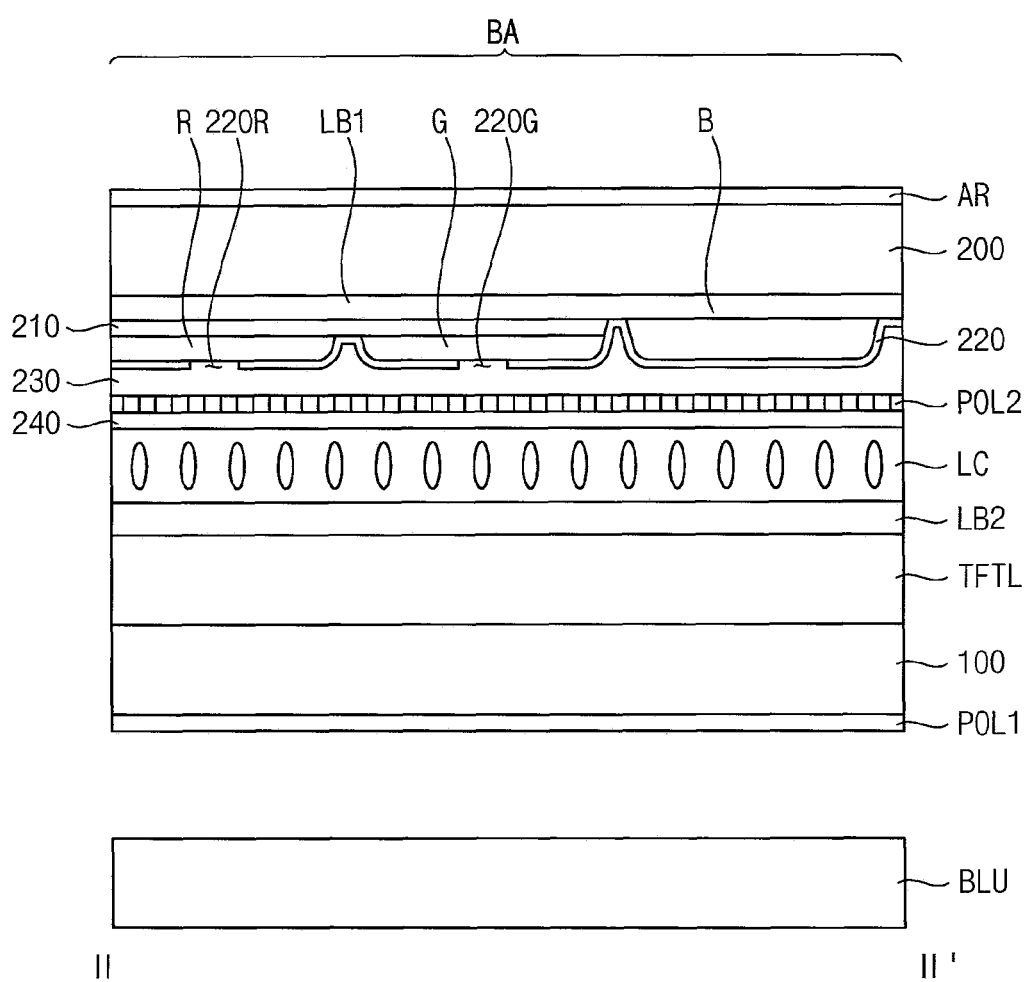
FIG. 13B is a cross-sectional view taken along a line II-II' of FIG. 12.
Figure 13C:
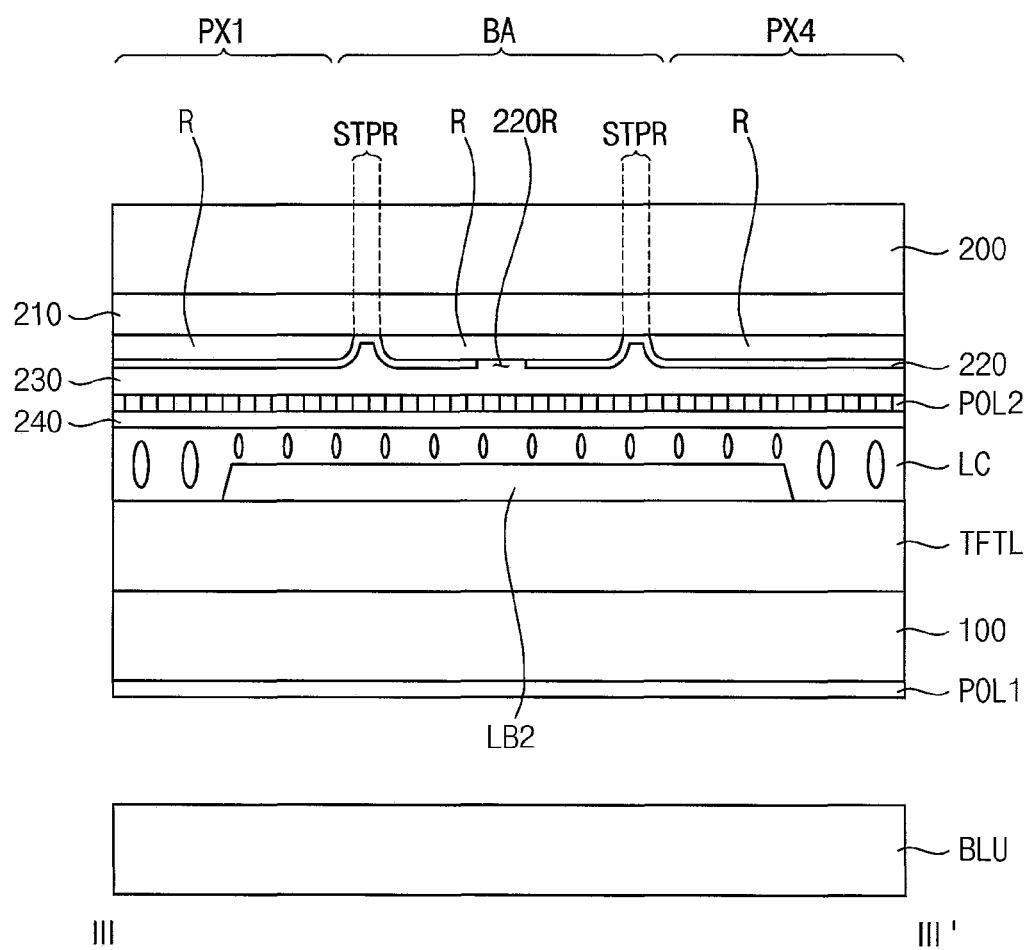
FIG. 13C is a cross-sectional view taken along a line III-III' of FIG. 12.

FIG. 12 is a plan view illustrating pixel areas of a portion of a display apparatus according to an example embodiment of the inventive concept. FIG. 13A is a cross-sectional view taken along a line I-I' of FIG. 12. FIG. 13B is a cross-sectional view taken along a line II-II' of FIG. 12. FIG. 13C is a cross-sectional view taken along a line III-III' of FIG. 12.

Referring to FIGS. 12 to 13C, the display apparatus may be substantially the same as the display apparatus of FIG. 4, except for shapes of a first stop pattern STPR and a second stop pattern STPG. Thus, any further detailed descriptions concerning the same elements will be omitted.

The first stop pattern STPR may extend to one edge of the first color conversion pattern R. The second stop pattern STPG may extend to one edge of the second color conversion pattern G.

According to the above-described embodiments, the stop patterns STPR and STPG may be formed at various positions in various shapes. In addition, since a length of one stop pattern in the first direction D1 is smaller than a width of the color conversion patterns R, and B in the first direction D1, the stop pattern may perform a function of preventing a deterioration diffusion of the color conversion pattern even if the position of the stop pattern is partially changed due to an alignment error during the stop pattern formation process. Here, the width of the stop pattern in the second direction D2 may be appropriately sized as required. For example, it may be formed at about 10 to 15 μm, in consideration of process conditions.

Figure 14:
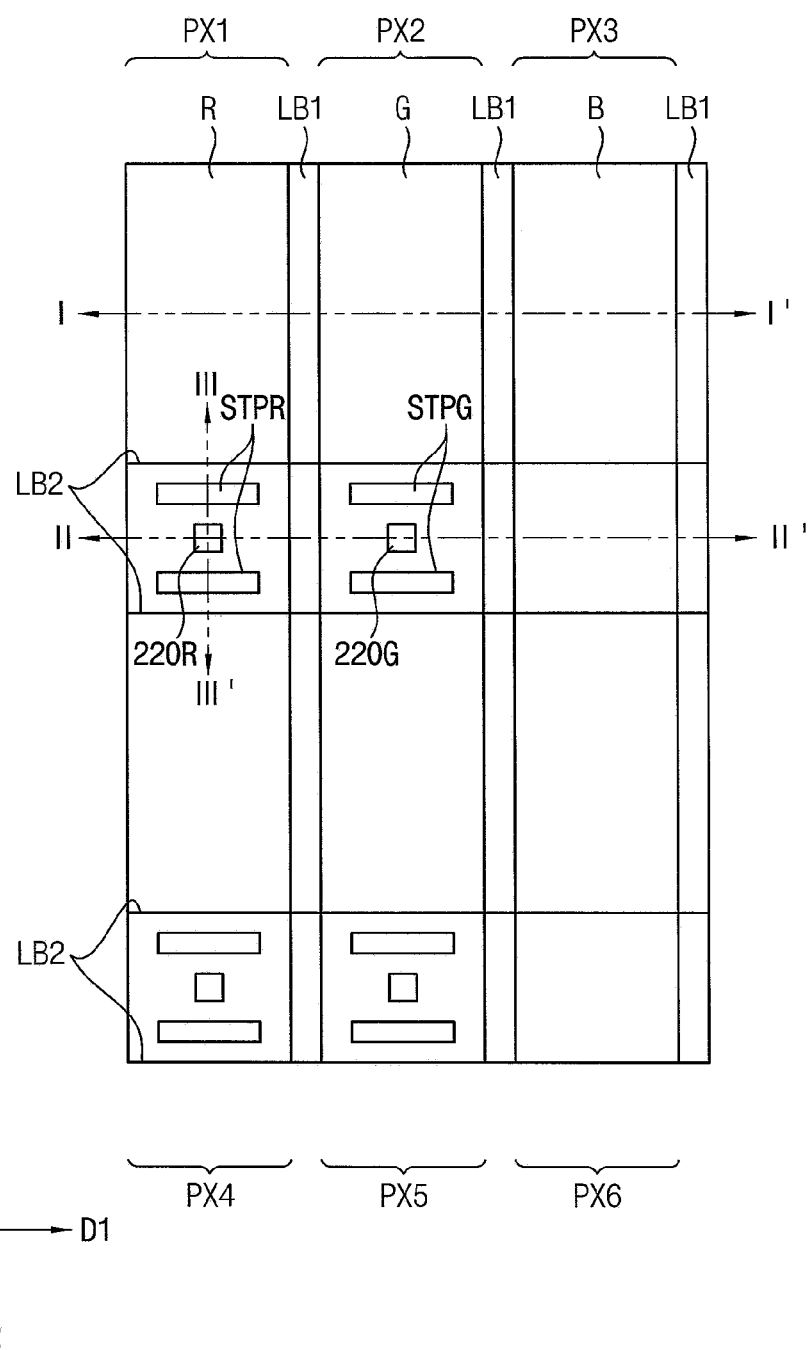
FIG. 14 is a plan view illustrating pixel areas of a portion of a display apparatus according to an example embodiment of the inventive concept.
Figure 15A:
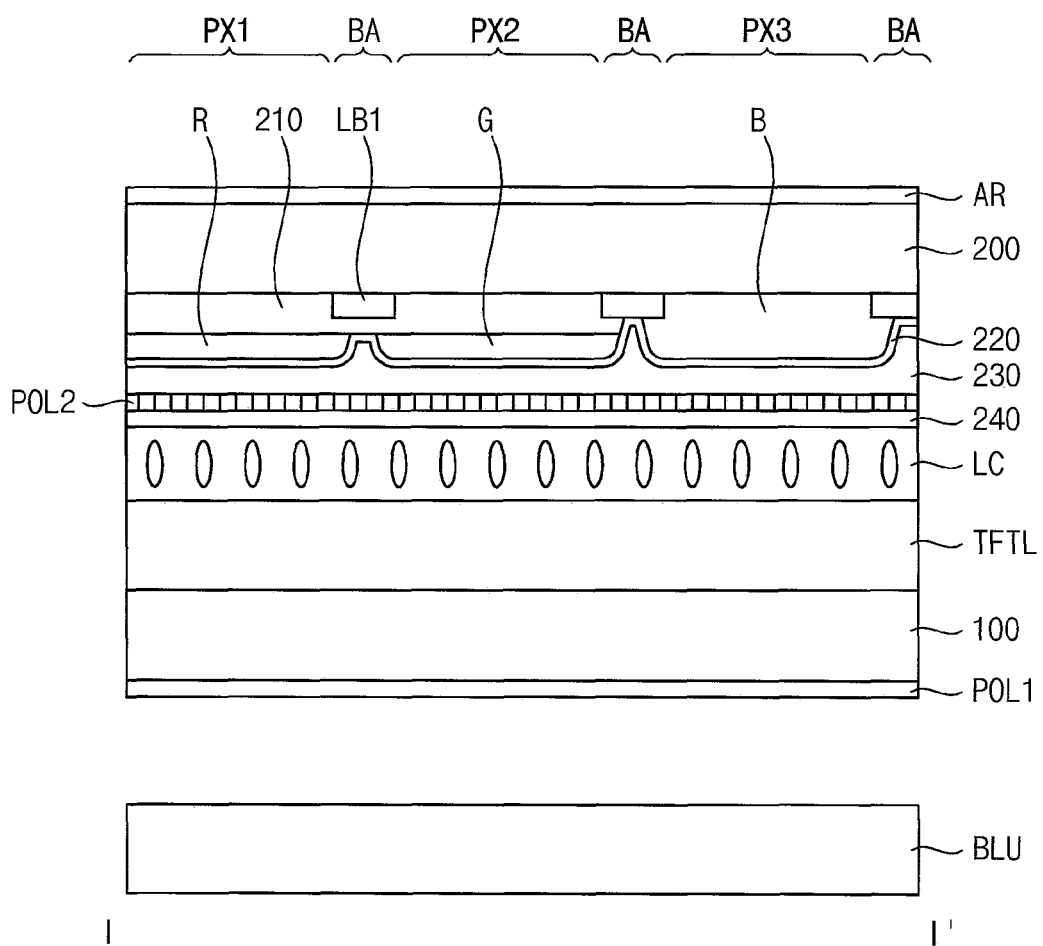
FIG. 15A is a cross-sectional view taken along a line I-I' of FIG. 14.
Figure 15B:
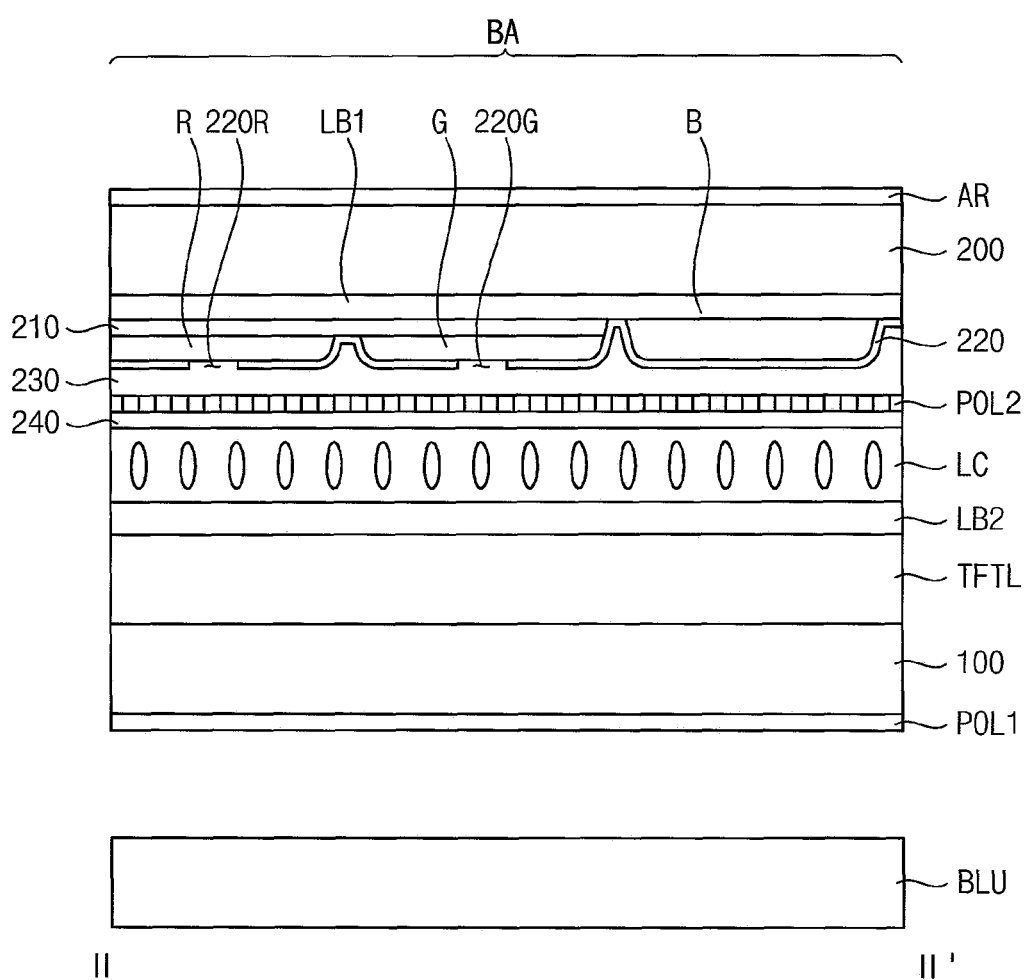
FIG. 15B is a cross-sectional view taken along a line II-II' of FIG. 14.
Figure 15C:
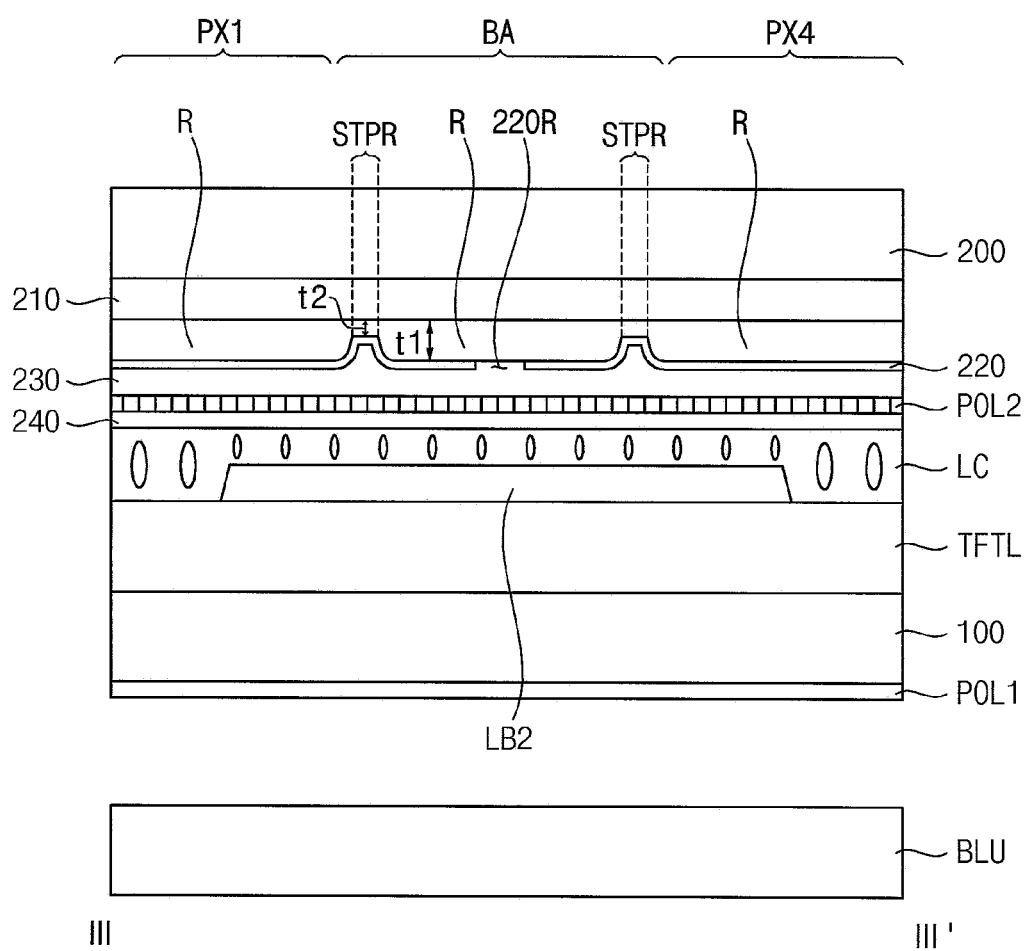
FIG. 15C is a cross-sectional view taken along a line III-III' of FIG. 14.

FIG. 14 is a plan view illustrating pixel areas of a portion of a display apparatus according to an example embodiment of the inventive concept. FIG. 15A is a cross-sectional view taken along a line I-I' of FIG. 14. FIG. 15B is a cross-sectional view taken along a line II-II' of FIG. 14. FIG. 15C is a cross-sectional view taken along a line III-III' of FIG. 14.

Referring to FIGS. 14 to 15C, the display apparatus may be substantially the same as the display apparatus of FIG. 4, except that a first stop pattern STPR and a second stop pattern STPG are groove patterns instead of opening patterns. Thus, any further detailed descriptions concerning the same elements will be omitted.

The first stop pattern STPR may be a groove pattern formed at a first color conversion pattern R. Accordingly, the first color conversion pattern R may have a second thickness t2 at the first stop pattern STPR, and have a first thickness t1 that is thicker than the second thickness t2 at another region.

The second stop pattern STPG may be a groove pattern formed at a second color conversion pattern G Accordingly, the second color conversion pattern G may have a second thickness t2 at the second stop pattern STPG and have a first thickness t1 that is thicker than the second thickness t2 at another region.

According to the present embodiment, the stop patterns STPR and STPG are formed in a groove pattern instead of the opening pattern. However, since the thickness of the color conversion pattern R or G at the stop pattern is thinner than its periphery, when the stop pattern is not only an opening pattern but also a groove pattern, diffusion of deterioration of the color conversion pattern in the second direction D2 can be prevented.

Figure 16:
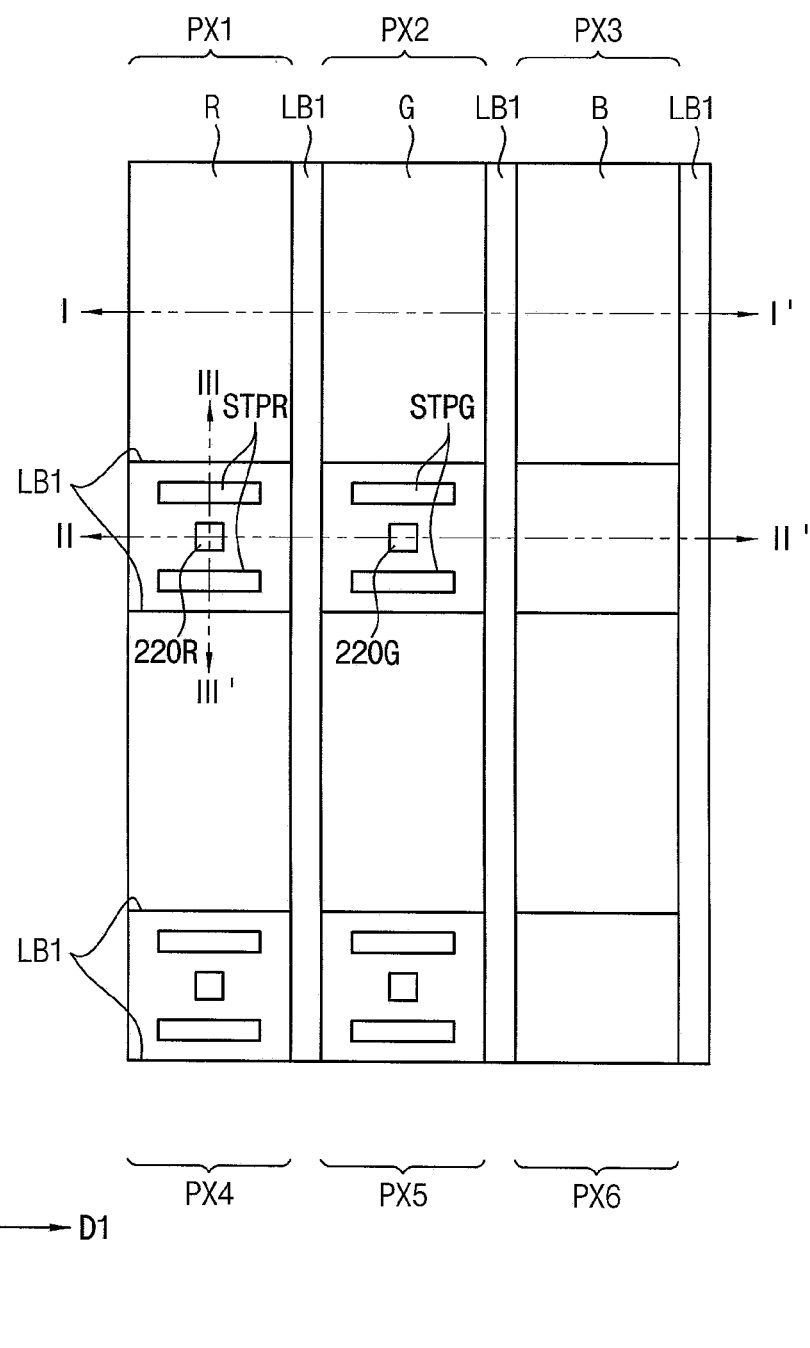
FIG. 16 is a plan view illustrating pixel areas of a portion of a display apparatus according to an example embodiment of the inventive concept.
Figure 17A:
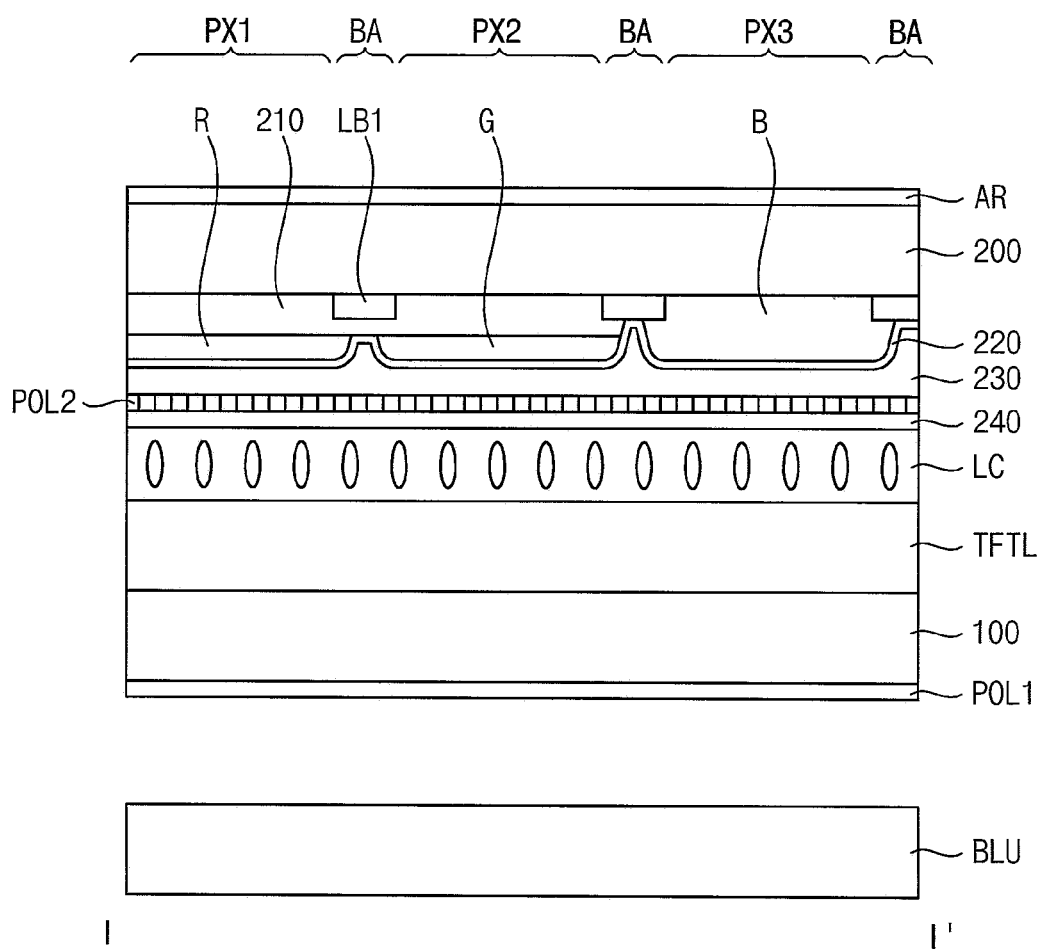
FIG. 17A is a cross-sectional view taken along a line I-I' of FIG. 16.
Figure 17B:
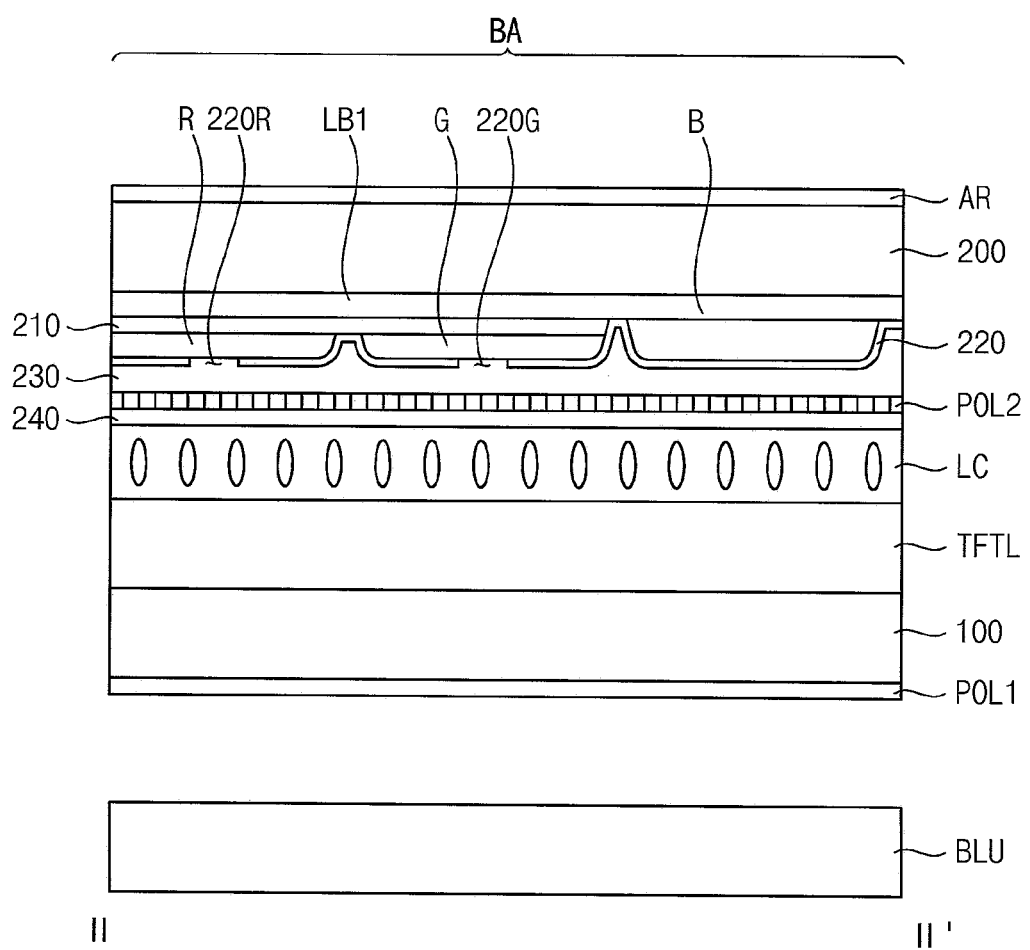
FIG. 17B is a cross-sectional view taken along a line II-II' of FIG. 16.
Figure 17C:
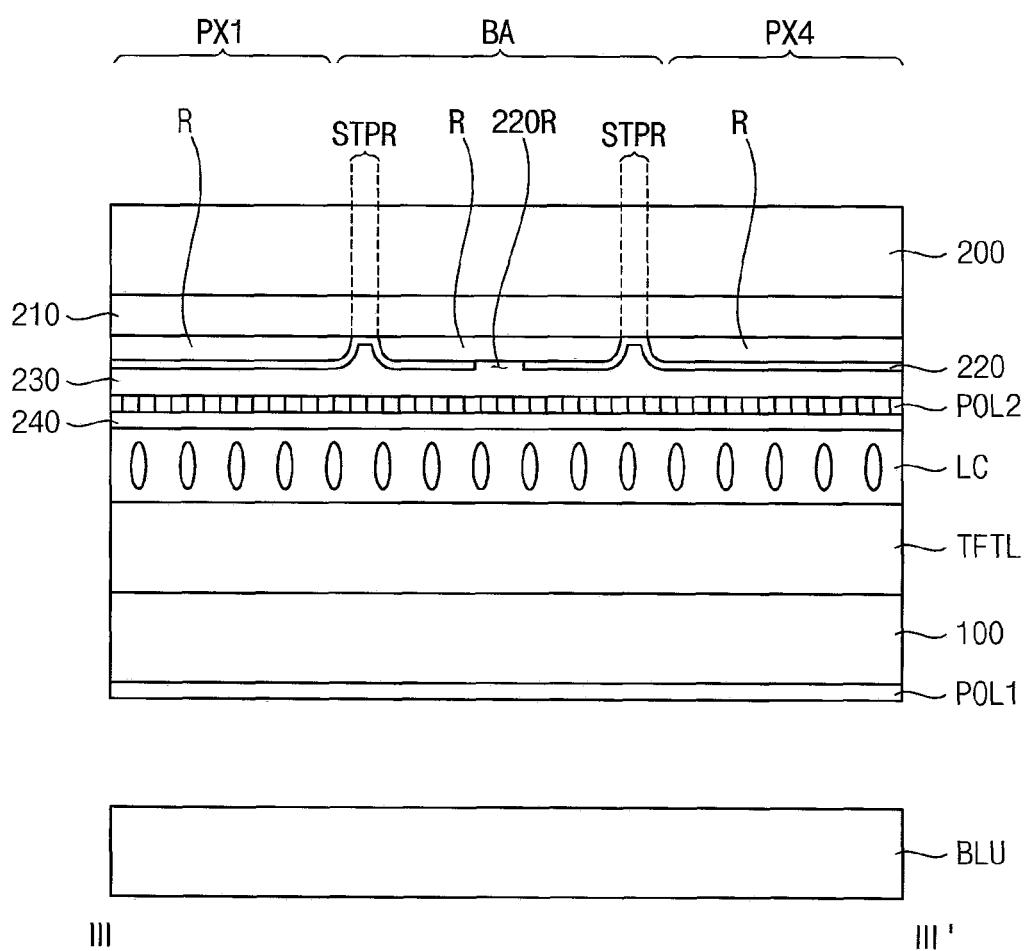
FIG. 17C is a cross-sectional view taken along a line III-III' of FIG. 16.

FIG. 16 is a plan view illustrating pixel areas of a portion of a display apparatus according to an example embodiment of the inventive concept. FIG. 17A is a cross-sectional view taken along a line I-I' of FIG. 16. FIG. 17B is a cross-sectional view taken along a line II-II' of FIG. 16. FIG. 17C is a cross-sectional view taken along a line III-III' of FIG. 16.

The first light blocking layer LB1 may extend in a first direction D1 and a second direction D2 to form a lattice structure. Accordingly, the first light blocking layer LB1 may be formed for an entire light blocking region BA. Here, the first light blocking layer LB1 may include a low reflectance material. Thus, as in the case of the embodiment shown in FIG. 2, since an area of the first light blocking layer LB1 in this embodiment is larger than that in the case where the display apparatus includes an additional second light blocking pattern (see LB2 in FIG. 2), a material having a low reflectance lower than that of the first light blocking pattern of FIG. 2 may be used.

Figure 18:
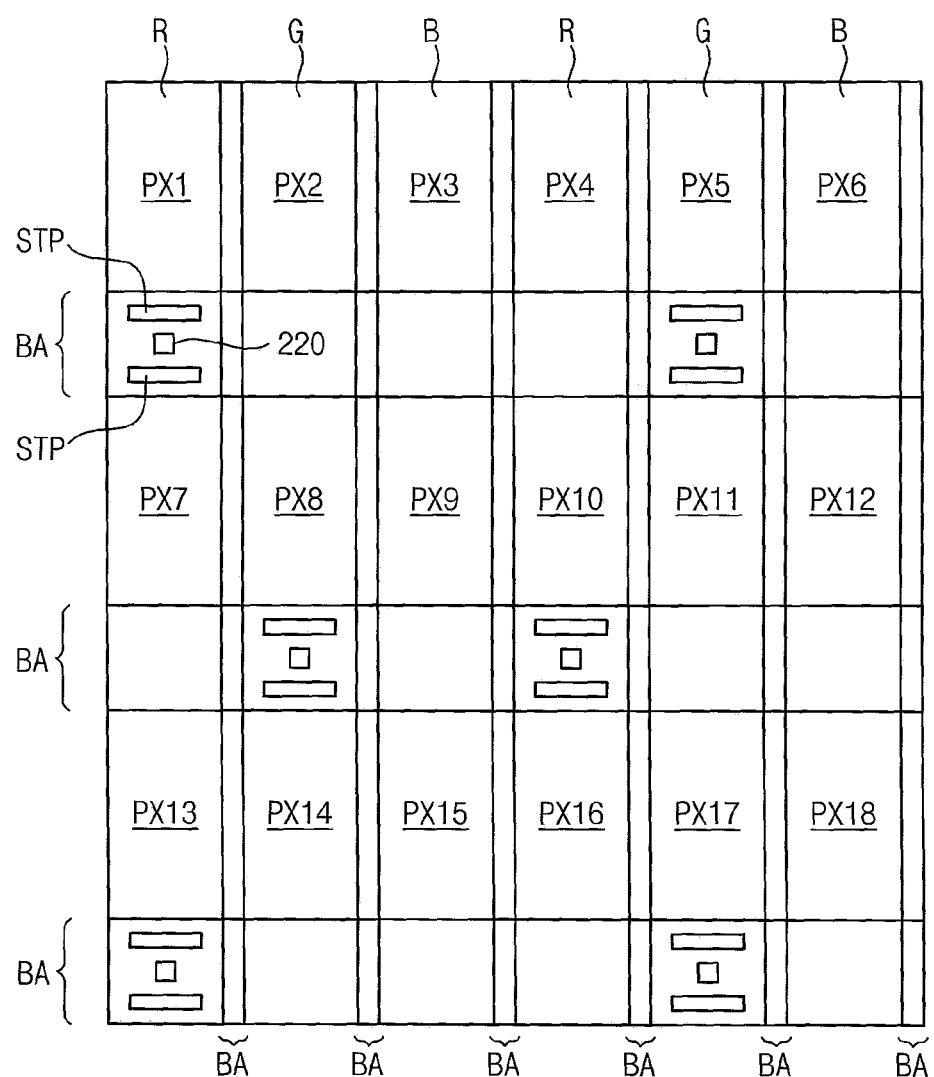
FIG. 18 is a plan view illustrating pixel areas of a portion of a display apparatus according to an example embodiment of the inventive concept.

FIG. 18 is a plan view illustrating pixel areas of a portion of a display apparatus according to an example embodiment of the inventive concept.

Referring to FIG. 18, the display apparatus may be substantially the same as the display apparatus of FIG. 4, except that a hole of a capping layer and a stop pattern of the color conversion pattern are formed one for several pixel areas. Thus, any further detailed descriptions concerning the same elements will be omitted.

The display apparatus may include a plurality of pixel areas. The pixel areas may be arranged in a matrix of 3 rows*6 columns. The pixel areas may include a first pixel area PX1, a second pixel area PX2, a third pixel area PX3, a fourth pixel area PX4, a fifth pixel area PX5, a sixth pixel area PX6, a seventh pixel area PX7, a eighth pixel area PX8, a ninth pixel area PX9, a tenth pixel area PX10, a eleventh pixel area PX11, a twelfth pixel area PX12, a thirteenth pixel area PX13, a fourteenth pixel area PX14, a fifteenth pixel area PX15, a sixteenth pixel area PX16, a seventeenth pixel area PX17 and eighteenth pixel area PX18. A light blocking area BA that separates the pixel areas and blocks light may be formed between the first to eighteenth pixel areas.

A hole 220 may be formed through the capping layer, so that a first color conversion pattern R or a second color conversion pattern G may be exposed by the hole 220. A stop pattern STP may be formed at the first color conversion pattern R or at the second color conversion pattern G adjacent to the hole 220 in the second direction D2. The hole 220 and the stop pattern STP may be formed for every several pixel areas along the first direction D1 and the second direction D2. In the present embodiment, in corresponding to the first color conversion pattern R, the hole 220 and the stop pattern STP are formed in a light blocking area BA adjacent to each of the first pixel area PX1, the tenth pixel area PX10, the thirteenth pixel area PX13. In corresponding to the second color conversion pattern G, the hole 220 and the stop pattern STP are formed in the fifth pixel area PX5, the eighth pixel area PX8 and the seventeenth pixel area PX17.

In the present embodiment, although the holes and the stop patterns are formed for each of two pixel areas having the same color and disposed adjacent to each other in the first direction or the second direction, it is not limited thereto. The holes and the stop pattern may be arranged in various ways.

FIGS. 19A, 19B, 19C, 19D and 19E are cross-sectional views illustrating a method of manufacturing a display apparatus of FIG. 2.

Figure 19A:
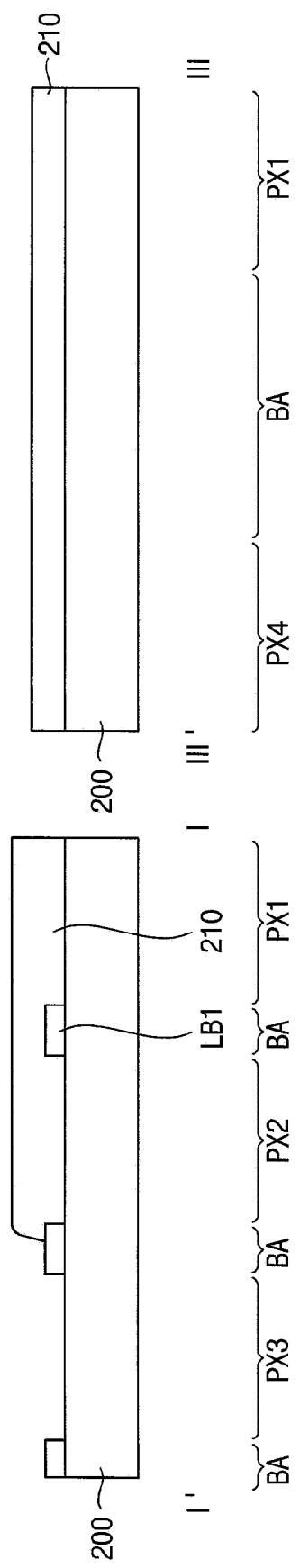
FIGS. 19A, 19B, 19C, 19D and 19E are cross-sectional views illustrating a method of manufacturing a display apparatus of FIG. 2.

Referring to FIG. 19A, a first light blocking pattern LB1 may be formed on a second base substrate 200. A light blocking layer may be formed on the second base substrate 200, and then the light blocking layer may be partially etched by a photolithography process or an etching process using an additional mask. Hence, the first light blocking layer LB1 may be obtained. The light blocking layer may be formed by stacking a plurality of metal layers.

A blue light blocking layer 210 may be formed on the second base substrate 200 on which the first light blocking layer LB1 is formed. The blue light blocking pattern 210 may be formed by alternately laminating at least two layers with different refractive indices. The blue light blocking pattern 210 may be formed by coating a photoresist material containing a material blocking blue light, and exposing and developing the photoresist material.

Figure 19B:
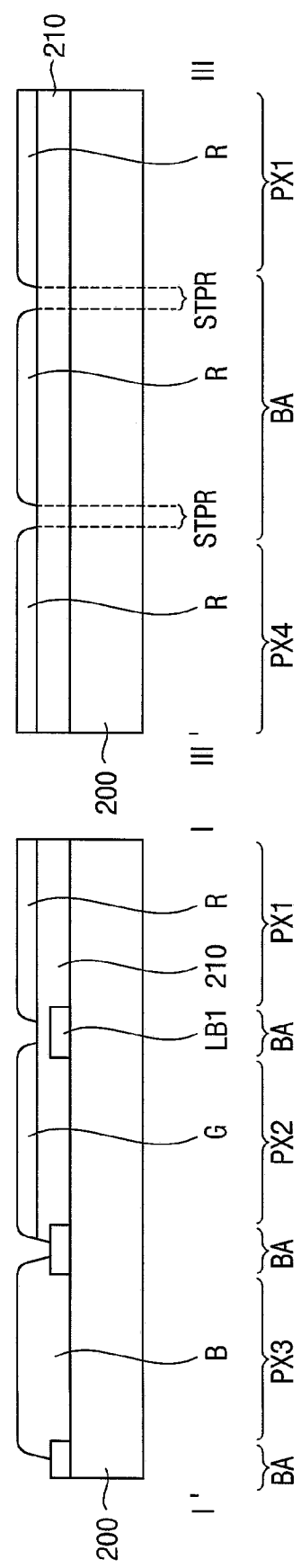
Figure 19C:
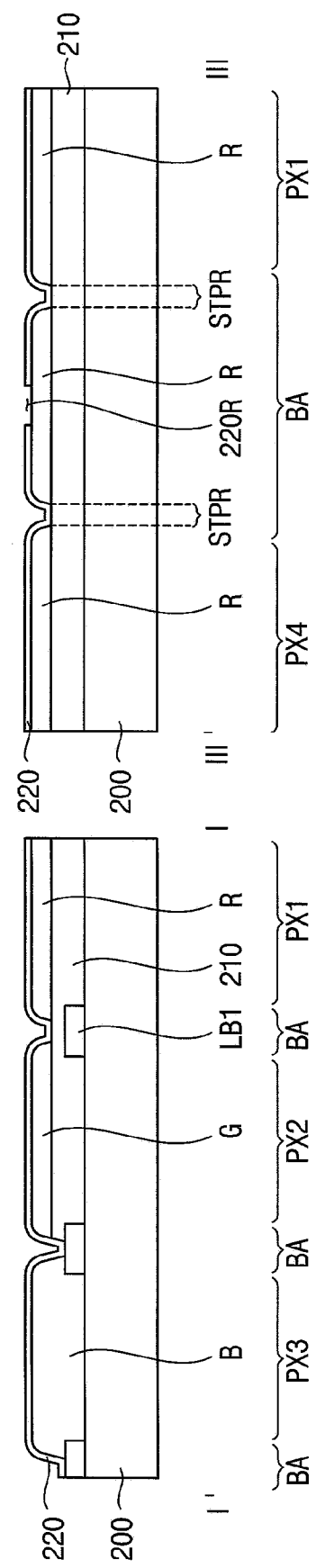

Referring to FIG. 19B, a first color conversion pattern R and a second color conversion pattern G may be formed on the second base substrate 200 on which the blue light blocking pattern 210 is formed. A third color conversion pattern B may be formed on the second base substrate 200.

The first color conversion pattern R may be formed by coating a photoresist material containing red quantum dot particles and/or red phosphor, and exposing and developing the photoresist material. The second color conversion pattern G may be formed by coating a photoresist material containing green quantum dot particles and/or red phosphor, exposing and developing the photoresist material. The third color conversion pattern B may be formed by coating a photoresist material containing blue pigment and/or scattering particles, exposing and developing the photoresist material. In some example embodiment, the blue light blocking pattern 210, the first color conversion pattern R, the second color conversion pattern G and the third color conversion pattern B may be formed by ink jet printing method, etc.

Here, a first stop pattern STPR (and/or second and third stop pattern) may be formed at the first color conversion pattern R (and/or the second and third color conversion pattern). The first stop pattern STPR may be simultaneously patterned in the above mentioned exposure and development processes. In some example embodiments, the first color conversion pattern R may be formed and then, a portion of the first color conversion pattern R may be removed by laser process, etc. to form the first stop pattern STPR Referring to FIG. 19C, a capping layer 220 may be formed on the first to third color conversion patterns R, G and B, and the first light blocking layer LB1. A first hole 220R (and/or second and third hole) that exposes the first color conversion pattern R (and/or the second and third color conversion pattern) may be formed through the capping layer 220. The first hole 220R be formed in various ways depending on the material forming the capping layer 220.

Figure 19D:
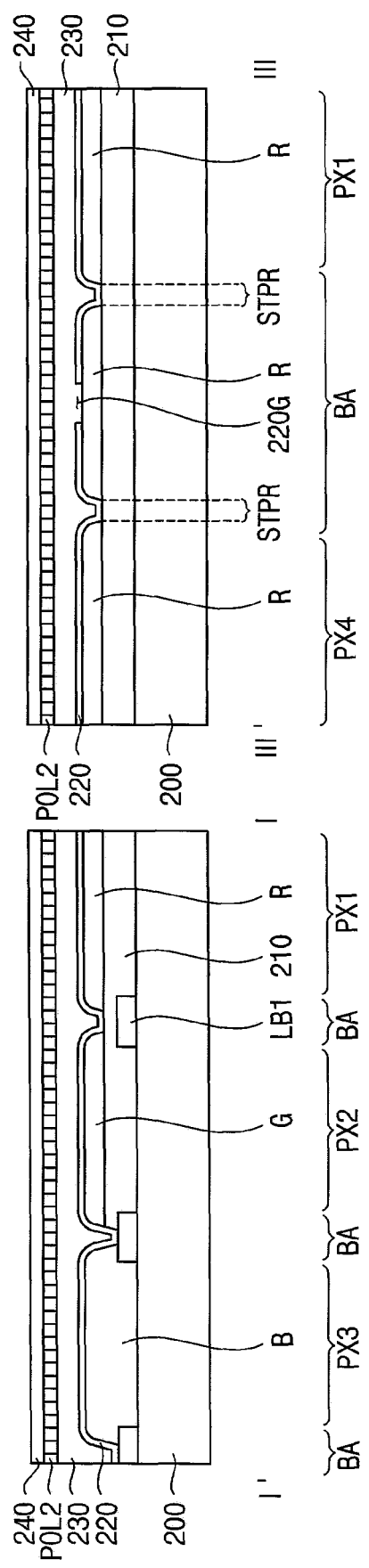

Referring to FIG. 19D, a planarization layer 230 may be formed on the capping layer 220. A second polarizer POL2 may be formed on the planarization layer 230. An insulation layer 240 may be formed on the second polarizer POL2. Accordingly, the photoluminescence apparatus may be formed.

Figure 19E:
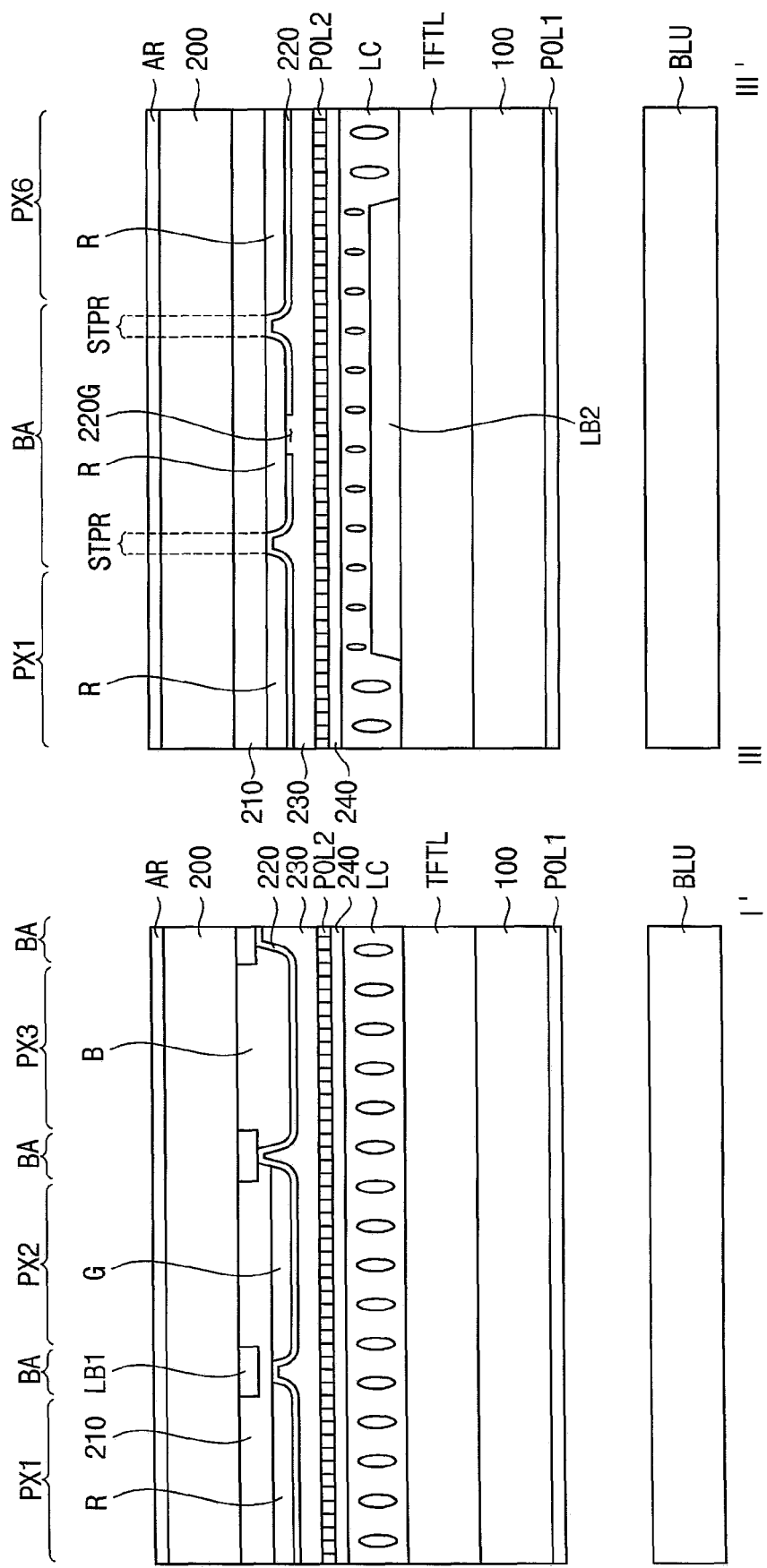

Referring to FIG. 19E, a thin film transistor layer TFTL may be formed on a first base substrate 100. A liquid crystal layer LC may be formed on the thin film transistor layer TFTL and the insulation layer 240 of the photoluminescence apparatus. A first polarizer POL1 may be attached on the first base substrate 100. A backlight unit BLU that emits blue light may be provided. Configurations of the display apparatus may be manufactured by conventional general methods. Thus, the display apparatus may be manufactured.

FIGS. 20A, 20B, 20C and 20D are cross-sectional views illustrating a method of manufacturing a display apparatus of FIG. 6.

Figure 20A:
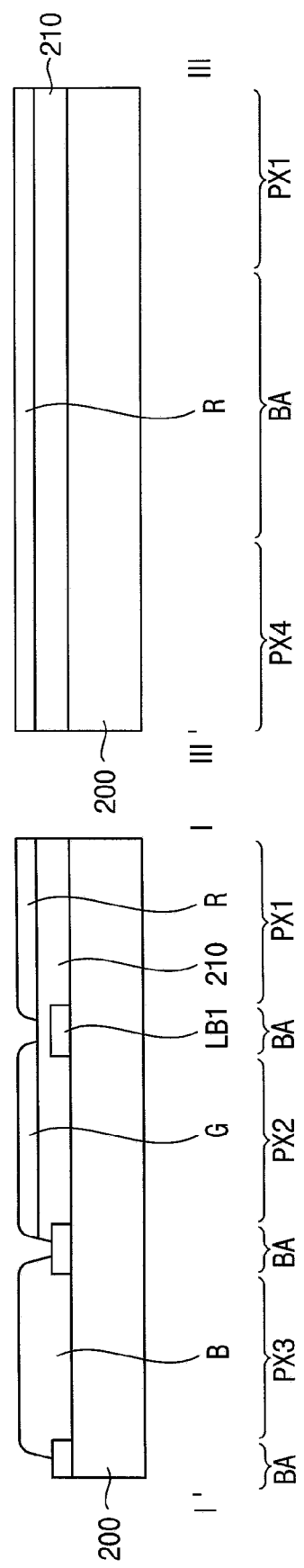
FIGS. 20A, 20B, 20C and 20D are cross-sectional views illustrating a method of manufacturing a display apparatus of FIG. 6.
Figure 20B:
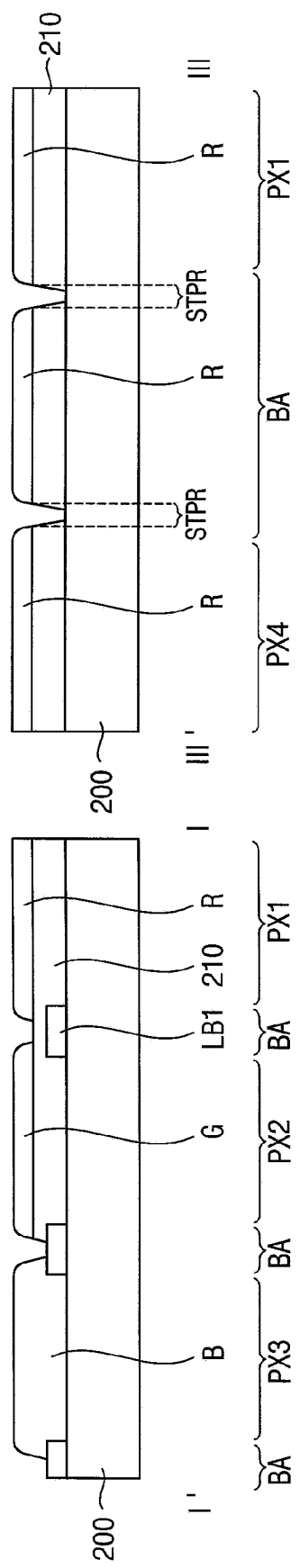
Figure 20C:
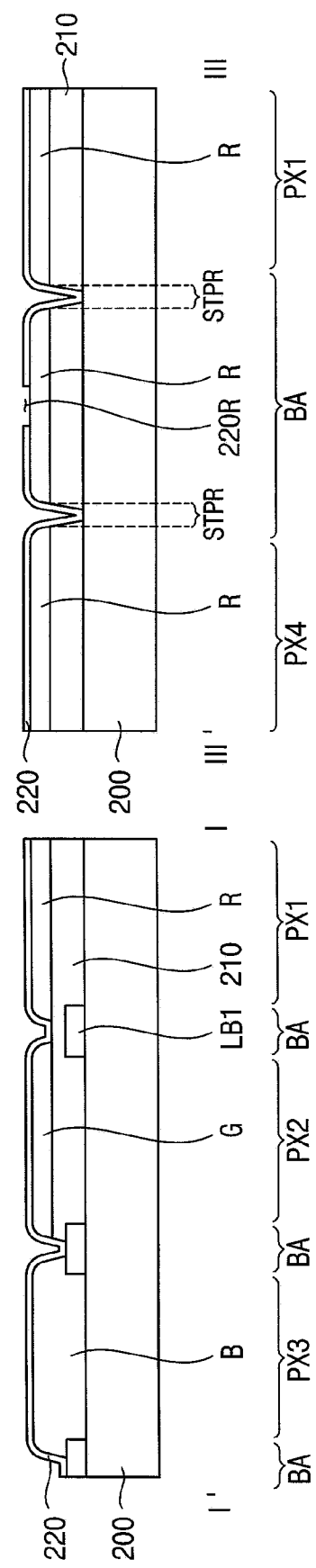
Figure 20D:
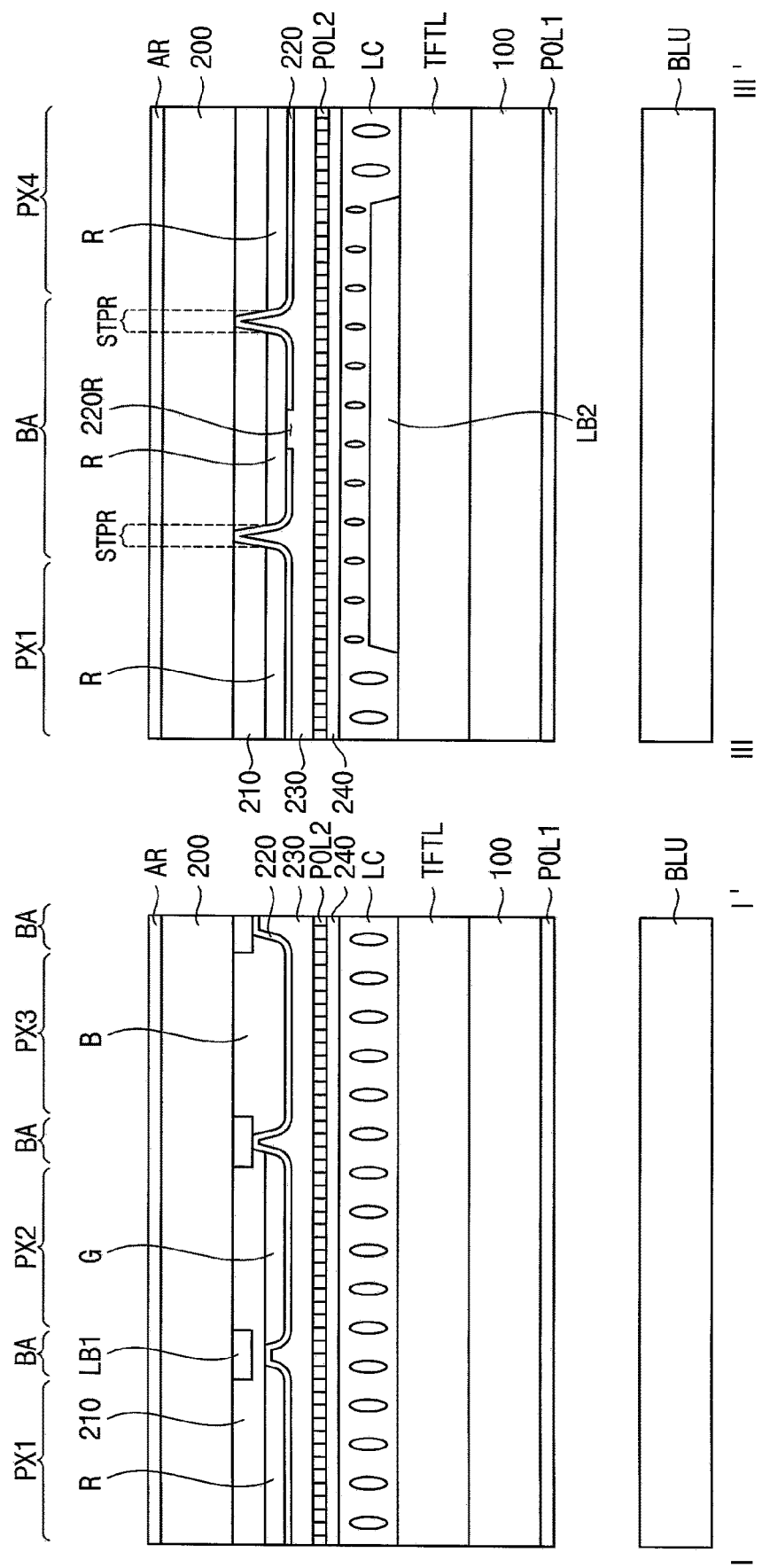

Referring to FIGS. 20 to 20D, the method may be substantially the same as the method of FIGS. 19A to 19E, except for a shape of a first stop pattern STPR. Thus, any further detailed descriptions concerning the same elements will be omitted.

A blue light blocking pattern 210, a first color conversion pattern R, a second color conversion pattern G and a third color conversion pattern B may be formed on a second base substrate 200 on which a first light blocking pattern LB1 is formed. A first stop pattern STPR may be formed by removing a portion of the first color conversion pattern R and a portion of the blue light blocking pattern 210 after the first color conversion pattern R is formed. In some example embodiment, the first color conversion pattern R having an opening pattern corresponding to the first stop pattern STPR may be formed on the blue light blocking pattern 210 having an opening pattern corresponding to the to form the first stop pattern STPR.

And then, other configurations of the display apparatus may be formed. The above-described structures may be manufactured by conventional general methods. Thus, the display apparatus may be manufactured.

FIGS. 21A, 21B, 21C and 21D are cross-sectional views illustrating a method of manufacturing a display apparatus of FIG. 8.

Figure 21A:
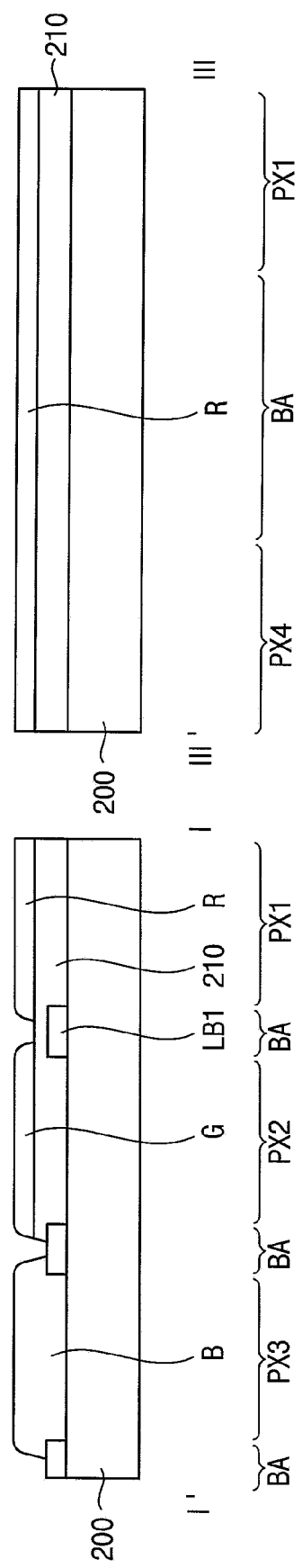
FIGS. 21A, 21B, 21C and 21D are cross-sectional views illustrating a method of manufacturing a display apparatus of FIG. 8.
Figure 21B:
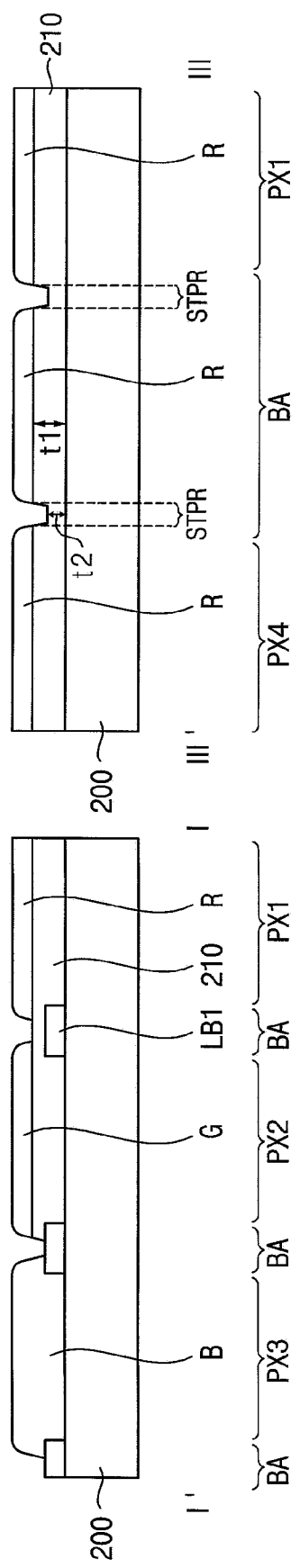
Figure 21C:
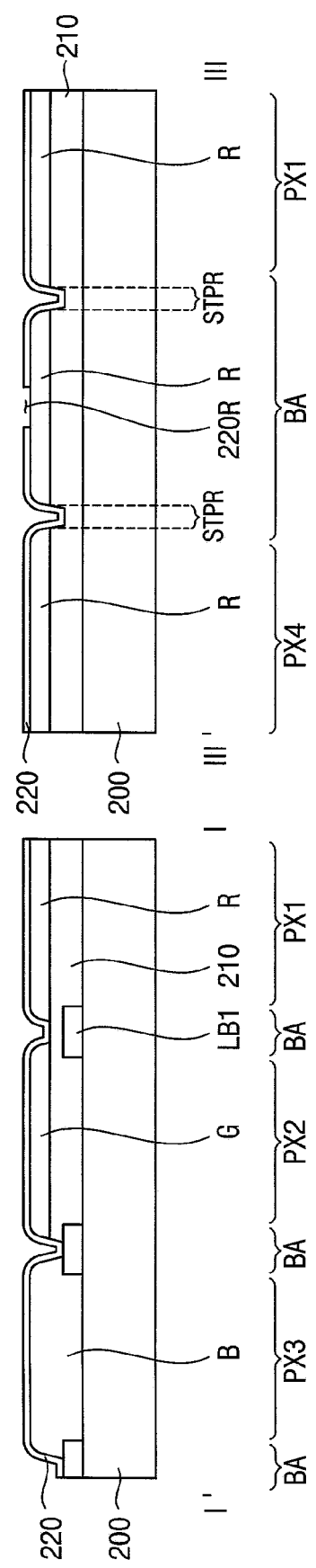
Figure 21D:
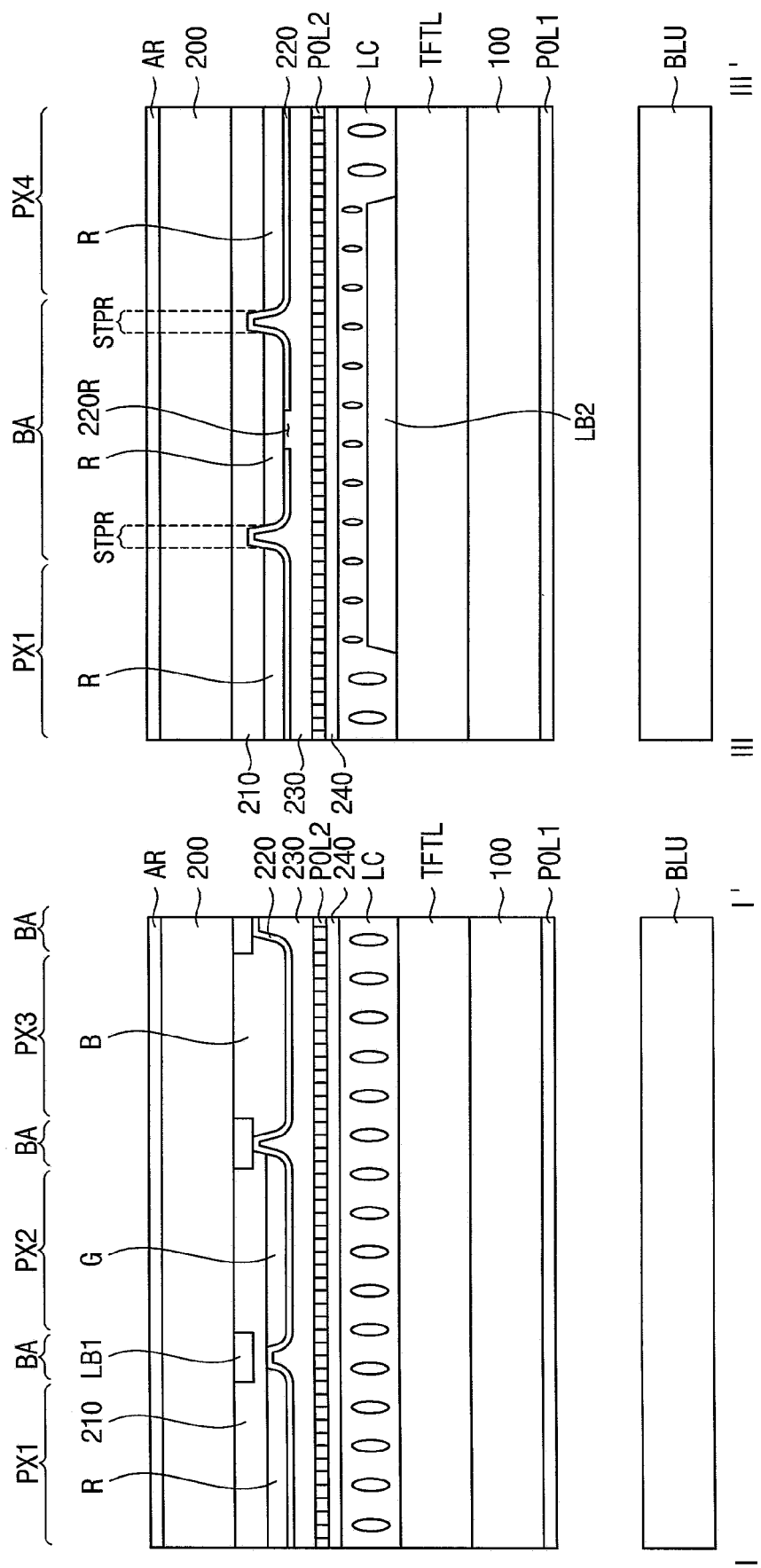
Figure 22A:
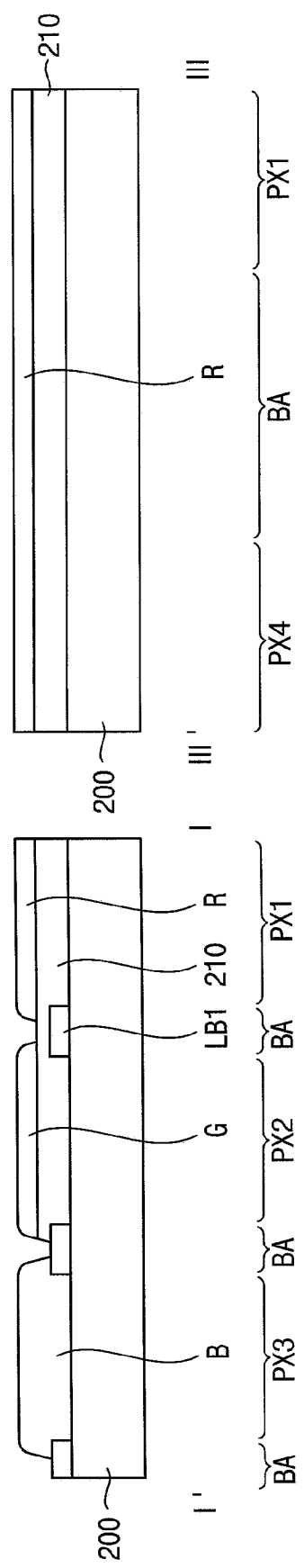
Figure 22B:
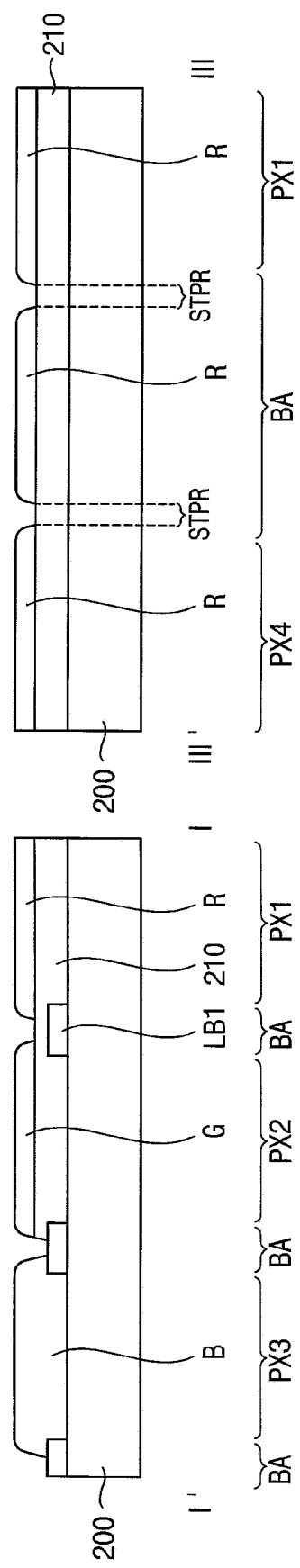

Referring to FIGS. 21 to 21D, the method may be substantially same as the method of FIGS. 19A to 19E, except for a shape of a first stop pattern STPR. Thus, any further detailed descriptions concerning the same elements will be omitted.

A blue light blocking pattern 210, a first color conversion pattern R, a second color conversion pattern G and a third color conversion pattern B may be formed on a second base substrate 200 on which a first light blocking pattern LB1 is formed. A first stop pattern STPR may be formed by removing a portion of the first color conversion pattern R and a portion of the blue light blocking pattern 210 after the first color conversion pattern R is formed. In some example embodiment, the first color conversion pattern R having an opening pattern corresponding to the first stop pattern STPR may be formed on the blue light blocking pattern 210 having a groove pattern corresponding to the to form the first stop pattern STPR.

And then, other configurations of the display apparatus may be formed. The above-described structures may be manufactured by conventional general methods. Thus, the display apparatus may be manufactured.

FIGS. 22A, 22B, 22C and 22D are cross-sectional views illustrating a method of manufacturing a display apparatus of FIG. 14.

Referring to FIGS. 22 to 22D, the method may be substantially the same as the method of FIGS. 19A to 19E, except for a shape of a first stop pattern STPR. Thus, any further detailed descriptions concerning the same elements will be omitted.

A first stop pattern STPR may be formed by removing a portion of a first color conversion pattern R after the first color conversion pattern R is formed. In some example embodiment, a groove pattern corresponding to the first stop pattern STPR may be formed using a half tone mask when the first color conversion pattern R is formed.

And then, other configurations of the display apparatus may be formed. The above-described structures may be manufactured by conventional general methods. Thus, the display apparatus may be manufactured.

Although not shown, the display apparatus of FIGS. 4, 10, 12, and 16 may also be manufactured similarly to the methods shown in FIGS. 19A to 22D.

According to the present inventive concept, a display apparatus includes a capping layer having a first hole and a first color conversion pattern at which a first stop pattern is formed. The first hole is formed at the capping layer, so that an active unfilled area (AUA) defect due to out-gas from the first color conversion pattern may be decreased. The first spot pattern is formed in the first color conversion pattern. Therefore, even if a part of the first color conversion pattern around the first hole is deteriorated, since the deteriorated portion of the first color conversion pattern is formed only in the light blocking area, display quality degradation due to the deterioration of the first color conversion pattern can be prevented.

In addition, the first stop pattern may have a pattern shape capable of maintaining the quality of the display apparatus even if an alignment error occurs during the step of forming the first stop pattern.

The foregoing is illustrative of the inventive concept and is not to be construed as limiting thereof. Although a few example embodiments of the inventive concept have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific example embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. A photoluminescence apparatus, comprising:
   a base substrate;
   a first color conversion pattern disposed on the base substrate and having a color conversion material, wherein a first stop pattern is formed at the first color conversion pattern, the first stop pattern being an opening pattern or a groove pattern formed in the first color conversion pattern; and
   a capping layer disposed on the first color conversion pattern for capping the first color conversion pattern, wherein a first hole overlapping the first color conversion pattern in a plan view is formed through the capping layer, wherein the first stop pattern is disposed adjacent to the first hole in a plan view.

2. The photoluminescence apparatus of claim 1, wherein in a plan view, the first stop pattern is extended in a first direction, and spaced apart from the first hole in a second direction that is perpendicular to the first direction.

3. The photoluminescence apparatus of claim 2, wherein a width of the first stop pattern is about 10 to 15 um (micrometers).

4. The photoluminescence apparatus of claim 1, further comprising:
a first light blocking pattern disposed on the base substrate and extending in a second direction, and
wherein in a plan view, the first color conversion pattern extends in the second direction substantially perpendicular to a first direction, and
the first light blocking pattern is adjacent to the first color conversion pattern in the first direction and extends in the second direction.

5. The photoluminescence apparatus of claim 4, wherein the first light blocking pattern further extends in the first direction to form a lattice structure, and
the first light blocking pattern, the first hole and the first stop pattern are overlapped with each other.

6. The photoluminescence apparatus of claim 1, further comprising:
a blue light blocking pattern disposed on the base substrate;
a second color conversion pattern comprising green quantum dot particles and/or green phosphor; and
a third color conversion pattern disposed on the base substrate and comprising scattering particles and/or blue pigment,
wherein the first color conversion pattern comprises red quantum dot particles and/or red phosphor, and
the first color conversion pattern and the second color conversion pattern overlap the blue light blocking pattern.

7. The photoluminescence apparatus of claim 6, wherein a second hole is further formed at the capping layer overlapping the second color conversion pattern.

8. The photoluminescence apparatus of claim 6, wherein the first stop pattern is further formed in the blue light blocking pattern under the first color conversion pattern.

9. The photoluminescence apparatus of claim 1, wherein in a plan view, the first color conversion pattern extends in a second direction substantially perpendicular to the first direction, the first stop pattern comprises a 1a stop pattern and 1b stop pattern,
the 1a stop pattern is spaced apart from the first hole in the second direction, and
the 1b stop pattern is spaced apart from the first hole in the second direction opposite to the 1a stop pattern.

10. The photoluminescence apparatus of claim 9, wherein the 1a stop pattern and/or the 1b stop pattern extends to an edge of the first color conversion pattern.

11. A display apparatus, comprising:
a backlight unit generating a light;
a first base substrate disposed on the backlight unit;
a thin film transistor layer disposed on the first base substrate and comprising a thin film transistor;
a second base substrate opposite to the first base substrate;
a first color conversion pattern disposed on the base substrate and having a color conversion material, wherein a first stop pattern is formed at the first color conversion pattern, the first stop pattern being an opening pattern or a groove pattern formed in the first color conversion pattern;
a capping layer disposed on the first color conversion pattern for capping the first color conversion pattern, wherein a first hole overlapping the first color conversion pattern in a plan view is formed through the capping layer;
a liquid crystal layer disposed between the first base substrate and the second base substrate; and
a light blocking layer overlapping the thin film transistor, the first stop pattern and the first hole.

12. The display apparatus of claim 11, further comprising:
a blue light blocking pattern disposed on the first base substrate;
a second color conversion pattern comprising green quantum dot particles and/or green phosphor; and
a third color conversion pattern disposed on the first base substrate and comprising scattering particles and/or blue pigment,
wherein the first color conversion pattern comprises red quantum dot particles and/or red phosphor, and the first color conversion pattern and the second color conversion pattern overlap with the blue light blocking pattern, and
the backlight unit emits blue light.

13. The display apparatus of claim 11, wherein the light blocking pattern comprises a first light blocking pattern disposed between the liquid crystal layer and the second base substrate and a second light blocking pattern disposed between the liquid crystal layer and the first base substrate, and
the first hole and the first stop pattern are overlapped with the second light blocking pattern.

14. The display apparatus of claim 11, wherein the display apparatus comprises a plurality of pixel areas for displaying image and a light blocking area between the pixel areas having a lattice structure,
the first hole and the first stop pattern are repeatedly formed for every several pixel areas.

15. A method of manufacturing a photoluminescence apparatus, comprising:
forming a first color conversion pattern comprising a color conversion material for converting color of incident light, the first color conversion pattern including a first stop pattern that is an opening pattern or a groove pattern formed in the first color conversion pattern; and
forming a capping layer on the first color conversion pattern for capping the first color conversion pattern, wherein a first hole is formed through the capping layer to expose a portion of the first color conversion pattern.

16. The method of claim 15, wherein the first color conversion pattern is formed by coating a photoresist material containing quantum dot particles and/or phosphor, exposing and developing the photoresist material, and
the first stop pattern is simultaneously patterned when the first color conversion pattern is formed.

17. The method of claim 15, wherein the first color conversion pattern is formed by coating a photoresist material containing quantum dot particles and/or phosphor, exposing and developing the photoresist material,
and then, the first stop pattern is formed by removing a portion of the first color conversion pattern.

18. The method of claim 15, further comprising:
forming a blue light blocking pattern on the base substrate;

forming a second color conversion pattern comprising green quantum dot particles and/or green phosphor on the blue light blocking pattern;
forming a third color conversion pattern disposed on the first base substrate and comprising scattering particles and/or blue pigment on the base substrate;
forming a planarization layer on the capping layer;
forming a wire grid polarizer on the planarization layer; and
forming an insulation layer on the wire grid polarizer.

* * * * *